United States Patent
Uhm et al.

(10) Patent No.: US 12,105,987 B2
(45) Date of Patent: Oct. 1, 2024

(54) STORAGE CONTROLLER AND ELECTRONIC SYSTEM

(71) Applicant: SAMSUNG ELECTRONICS CO., LTD., Suwon-si (KR)

(72) Inventors: Junyong Uhm, Seoul (KR); Eunjoo Oh, Suwon-si (KR); Junggyu Kim, Hwaseong-si (KR); Jaesub Kim, Seoul (KR); Yangwoo Roh, Hwaseong-si (KR); Jeongbeom Seo, Seoul (KR); Jaewon Song, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/870,096

(22) Filed: Jul. 21, 2022

(65) Prior Publication Data

US 2023/0153020 A1  May 18, 2023

(30) Foreign Application Priority Data

Nov. 16, 2021  (KR) .......................... 10-2021-0157565

(51) Int. Cl.
*G06F 3/06* (2006.01)

(52) U.S. Cl.
CPC .......... *G06F 3/0655* (2013.01); *G06F 3/0619* (2013.01); *G06F 3/0679* (2013.01)

(58) Field of Classification Search
CPC ...... G05B 13/00–048; G05B 15/00–02; G05B 17/00–02; G06F 1/00–3296;

(Continued)

(56) References Cited

U.S. PATENT DOCUMENTS 4,669,081 A * 5/1987 Mathewes, Jr .............................. G01R 31/318342
714/726
4,680,761 A * 7/1987 Burkness ....... G01R 31/318533
714/724

(Continued)

OTHER PUBLICATIONS

WinDBG—The Basics for Debugging Crash Dumps in Windows 10; Gav W; Oct. 9, 2015; retrieved from https://www.tenforums.com/tutorials/5558-windbg-basics-debugging-crash-dumps-windows-10-a.html on Sep. 17, 2023 (Year: 2015).*

(Continued)

*Primary Examiner* — Daniel C. Chappell
(74) *Attorney, Agent, or Firm* — Sughrue Mion, PLLC

(57) ABSTRACT

An electronic system includes: a host; and a storage device configured to exchange data with the host using an interface protocol. The host provides a fault insertion command, including a fault type, a target location, and a fault condition, to the storage device, based on the interface protocol. The storage device performs a fault detection operation, selected based on the fault type among an assert code execution operation, a memory polling operation, an interrupt polling operation, and a latency detection operation, on the target location in response to the fault insertion command, and stores a snapshot of the storage device when the fault condition is detected as a result of performing the fault detection operation. The host obtains the stored snapshot using the interface protocol, and debugs the storage device using the obtained snapshot.

19 Claims, 19 Drawing Sheets

(58) Field of Classification Search
CPC .............. G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 18/00–41; G06F 17/00–40; G06F 21/00–88; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004; G06F 2216/00–17; G06F 2221/00–2153; G06N 3/00–126; G06N 5/00–048; G06N 7/00–08; G06N 10/00; G06N 20/00–20; G06N 99/00–007; G06T 1/00–60; G06V 30/00–43; G11B 20/00–24; G11B 33/00–1493; G11C 11/00–5692; G11C 13/00–06; G11C 14/00–009; G11C 15/00–06; G11C 16/00–3495; G11C 17/00–18; G11C 2207/00–229; G11C 2216/00–30; H01L 25/00–50; H01L 2225/00–1094; H03M 7/00–707; H04L 9/00–38; H04L 12/00–66; H04L 41/00–5096; H04L 49/00–9094; H04L 61/00–59; H04L 67/00–75

See application file for complete search history.

(56) References Cited

U.S. PATENT DOCUMENTS

| | | | | |
|---|---|---|---|---|
| 5,539,753 | A * | 7/1996 | Connor | G01R 31/318516 |
| | | | | 714/E11.171 |
| 6,886,116 | B1 * | 4/2005 | MacLellan | G06F 11/2215 |
| | | | | 714/48 |
| 7,672,803 | B1 * | 3/2010 | Lee | G11C 29/44 |
| | | | | 702/117 |
| 7,886,206 | B2 * | 2/2011 | Park | G11C 29/56008 |
| | | | | 714/719 |
| 8,966,319 | B2 | 2/2015 | Fai et al. | |
| 9,430,314 | B2 | 8/2016 | Atri et al. | |
| 9,542,287 | B1 | 1/2017 | Jean | |
| 10,176,029 | B2 | 1/2019 | Choi et al. | |
| 10,748,638 | B2 | 8/2020 | Cho | |
| 10,761,969 | B2 | 9/2020 | Jung et al. | |
| 11,307,793 | B2 * | 4/2022 | Seo | G11C 29/14 |
| 11,392,313 | B2 * | 7/2022 | Seo | G06F 3/0604 |
| 2004/0073841 | A1 | 4/2004 | Toros et al. | |
| 2005/0018517 | A1 * | 1/2005 | Collura | G11C 17/18 |
| | | | | 365/225.7 |
| 2012/0084759 | A1 * | 4/2012 | Candea | G06F 9/45504 |
| | | | | 717/134 |
| 2019/0340058 | A1 * | 11/2019 | Sasidharan | G06F 11/079 |
| 2021/0191644 | A1 * | 6/2021 | Seo | G06F 3/0653 |
| 2021/0191645 | A1 * | 6/2021 | Seo | G06F 3/0679 |
| 2022/0137859 | A1 * | 5/2022 | Ahn | G06F 3/0679 |
| | | | | 711/154 |

OTHER PUBLICATIONS

V. S. Kumar and J. Mohan, "Multiple single input change test vector for BIST schemes," 2014 International Conference on Green Computing Communication and Electrical Engineering (ICGCCEE), Coimbatore, India, 2014, pp. 1-4, doi: 10.1109/ICGCCEE.2014. 6922320. (Year: 2014).*

C. Vasanthanayaki, A. A. J. Pazhani and J. Johnson, "VLSI Implementation of Low Power Multiple Single Input Change (MSIC) Test Pattern Generation for BIST Scheme," 2014 Fifth International Symposium on Electronic System Design, Surathkal, India, 2014, pp. 187-191, doi: 10.1109/ISED.2014.45. (Year: 2014).*

J. L. Dailey, B. R. Garrison, M. D. Pulukuri and C. E. Stroud, "Built-In Self-Test of embedded memory cores in Virtex-5 Field Programmable Gate Arrays," 2011 IEEE 43rd Southeastern Symposium on System Theory, Auburn, AL, USA, 2011, pp. 220-225, doi: 10.1109/SSST.2011.5753810. (Year: 2011).*

C. -C. Yang et al., "A hybrid built-in self-test scheme for DRAMs," VLSI Design, Automation and Test(VLSI-DAT), Hsinchu, Taiwan, 2015, pp. 1-4, doi: 10.1109/VLSI-DAT.2015.7114502. (Year: 2015).*

F. Liang, L. Zhang, S. Lei, G. Zhang, K. Gao and B. Liang, "Test Patterns of Multiple SIC Vectors: Theory and Application in BIST Schemes," in IEEE Transactions on Very Large Scale Integration (VLSI) Systems, vol. 21, No. 4, pp. 614-623, Apr. 2013, doi: 10.1109/TVLSI.2012.2195689. (Year: 2013).*

C. -L. Hsu and T. -H. Chen, "Built-in Self-Test Design for Fault Detection and Fault Diagnosis in SRAM-Based FPGA," in IEEE Transactions on Instrumentation and Measurement, vol. 58, No. 7, pp. 2300-2315, Jul. 2009, doi: 10.1109/TIM.2009.2013921. (Year: 2009).*

L. Shaochong, H. Xueyan, S. Zhibiao and L. Feng, "A Class of SIC Circuits: Theory and Application in BIST Design," in IEEE Transactions on Circuits and Systems II: Express Briefs, vol. 55, No. 2, pp. 161-165, Feb. 2008, doi: 10.1109/TCSII.2007.903794. (Year: 2008).*

Donghoon Han, S. S. Akbay, S. Bhattacharya, A. Chatterjee and W. R. Eisenstadt, "On-chip self-calibration of RF circuits using specification-driven built-in self test (S-BIST)," 11th IEEE International On-Line Testing Symposium, French Riviera, France, 2005, pp. 106-111, doi: 10.1109/IOLTS.2005.50. (Year: 2005).*

Z. Cai and Y. Wang, "A Dynamically Configurable Chiplet Testing Technology Based on TAP Controller Architecture, " 2022 IEEE 5th International Conference on Electronics Technology (ICET), Chengdu, China, 2022, pp. 590-594, doi: 10.1109/ICET55676.2022.9824550. (Year: 2022).*

* cited by examiner

TABLE1

| Parameter | Description |
|---|---|
| Fault Type | Assert code execution |
| Target Core | FCore |
| Target Address | 0x2A987460 (ITCM ADDR) |
| Condition 1 | Register1 |
| Condition 2 | ≠ |
| Condition 3 | 0x5 |

Fault Condition { Condition 1, Condition 2, Condition 3 }

FIG. 6A

TABLE2

| Parameter | Description |
|---|---|
| Fault Type | Polling memory |
| Target Core | NCore |
| Target Address | 0x2AAE6818 (DTCM ADDR) |
| Condition 1 | == |
| Condition 2 | 0x100 |

Condition 1 and Condition 2 are grouped as Fault Condition.

FIG. 9

TABLE3

| Parameter | Description |
|---|---|
| Fault Type | Polling interrupt |
| Target Core | HCore |
| Condition 1 | GPIO |
| Condition 2 | 5 (Pin number) |

Fault Condition: Condition 1, Condition 2

FIG. 12

TABLE4

| Parameter | Description |
|---|---|
| Fault Type | Latency Detection |
| Target Core | FCore |
| Target Operation | Read |
| Condition 1 | 500 |
| Condition 2 | µs |
| Condition 3 | > |

Fault Condition: Condition 1, Condition 2, Condition 3

FIG. 15

STORAGE CONTROLLER AND ELECTRONIC SYSTEM

CROSS-REFERENCE TO RELATED APPLICATION

This application claims benefit of priority to Korean Patent Application No. 10-2021-0157565 filed on Nov. 16, 2021 in the Korean Intellectual Property Office, the disclosure of which is incorporated herein by reference in its entirety.

BACKGROUND

The disclosure relates to a storage controller and an electronic system.

A storage device using a memory device has advantages, such as improved stability and durability, significantly high data access speed, and low power consumption, due to the absence of a driving unit. The storage device having such advantages includes a universal serial bus (USB) memory device, a memory card having various interfaces, a solid-state drive (SSD), and the like.

A storage device may include volatile memory devices and nonvolatile memory devices. Volatile memory devices have high read and write speeds but lose stored data thereof when power supplies thereof are interrupted. Meanwhile, nonvolatile memory devices retain stored data thereof even when power supplies thereof are interrupted. Accordingly, nonvolatile memory devices are used to store data to be retained irrespective of whether power is supplied or not.

When an internal state of a storage device meets a predetermined fault condition, the storage device may generate a snapshot including data indicating a current state and may store the generated snapshot in a nonvolatile memory device. A host may obtain the snapshot stored in the nonvolatile memory device, and may use the obtained snapshot to remove faults of the storage device.

SUMMARY

Example embodiments provide configurations and operations related to a storage device detecting a predetermined condition to generate a snapshot and providing the snapshot to a host through error parsing.

Example embodiments provide configurations and operations related to a storage controller supporting various types of fault detection operation, and storing a snapshot by detecting condition added according to a request of the host.

In accordance with an aspect of the disclosure, an electronic system includes a host; and a storage device configured to exchange data with the host using an interface protocol, wherein the host is configured to provide a fault insertion command including a fault type, a target location, and a fault condition, to the storage device, based on the interface protocol, wherein the storage device is configured to perform a fault detection operation, selected based on the fault type, the fault detection operation including one from among an assert code execution operation, a memory polling operation, an interrupt polling operation, and a latency detection operation, on the target location in response to the fault insertion command, and store a snapshot of the storage device when the fault condition is detected as a result of performing the fault detection operation, and wherein the host is configured to obtain the stored snapshot using the interface protocol, and debug the storage device using the obtained snapshot.

In accordance with an aspect of the disclosure, a storage controller configured to control a memory device, the storage controller including a plurality of processing cores; a debugging core; and a volatile memory, wherein the debugging core is configured to perform a fault detection operation by determining whether at least one of a register, a data tightly-coupled memory (DTCM), an interrupt, and an operation latency, associated with a selected target core among the plurality of processing cores, meets a fault condition based on a fault insertion command from a host, wherein the plurality of processing cores is configured to generate a snapshot based on data stored in instruction tightly-coupled memories (ITCMs), DTCMs included in the plurality of processing cores and the volatile memory, wherein the stored data is generated according to a result of performing the fault detection operation, and wherein the plurality of processing cores is configured to store the generated snapshot in the memory device.

In accordance with an aspect of the disclosure, a storage controller configured to control a memory device, the storage controller including a plurality of processing cores; and a debugging core configured to parse a defect insertion command from a host to extract a fault type, a target core, and a fault condition from the defect insertion command and to perform a fault detection operation on the target core among the plurality of processing cores to detect the fault condition, the fault detection operation being selected from among a plurality of fault detection operations, based on the fault type, wherein the plurality of processing cores is configured to generate a snapshot, representing current states of the memory device and the storage controller, in response to a detection of the fault condition and store the generated snapshot in the memory device.

BRIEF DESCRIPTION OF DRAWINGS

The above and other aspects, features, and advantages of certain embodiments of the disclosure will be more apparent from the following detailed description, taken in conjunction with the accompanying drawings in which:

FIGS. 4 to 6B are diagrams illustrating a first example of a fault detection operation.

FIGS. 7 to 9 are diagrams illustrating a second example of a fault detection operation.

FIGS. 10 to 12 are diagrams illustrating a third example of a fault detection operation.

FIGS. 13 to 15 are diagrams illustrating a fourth example of a fault detection operation.

DETAILED DESCRIPTION

Figure 1:
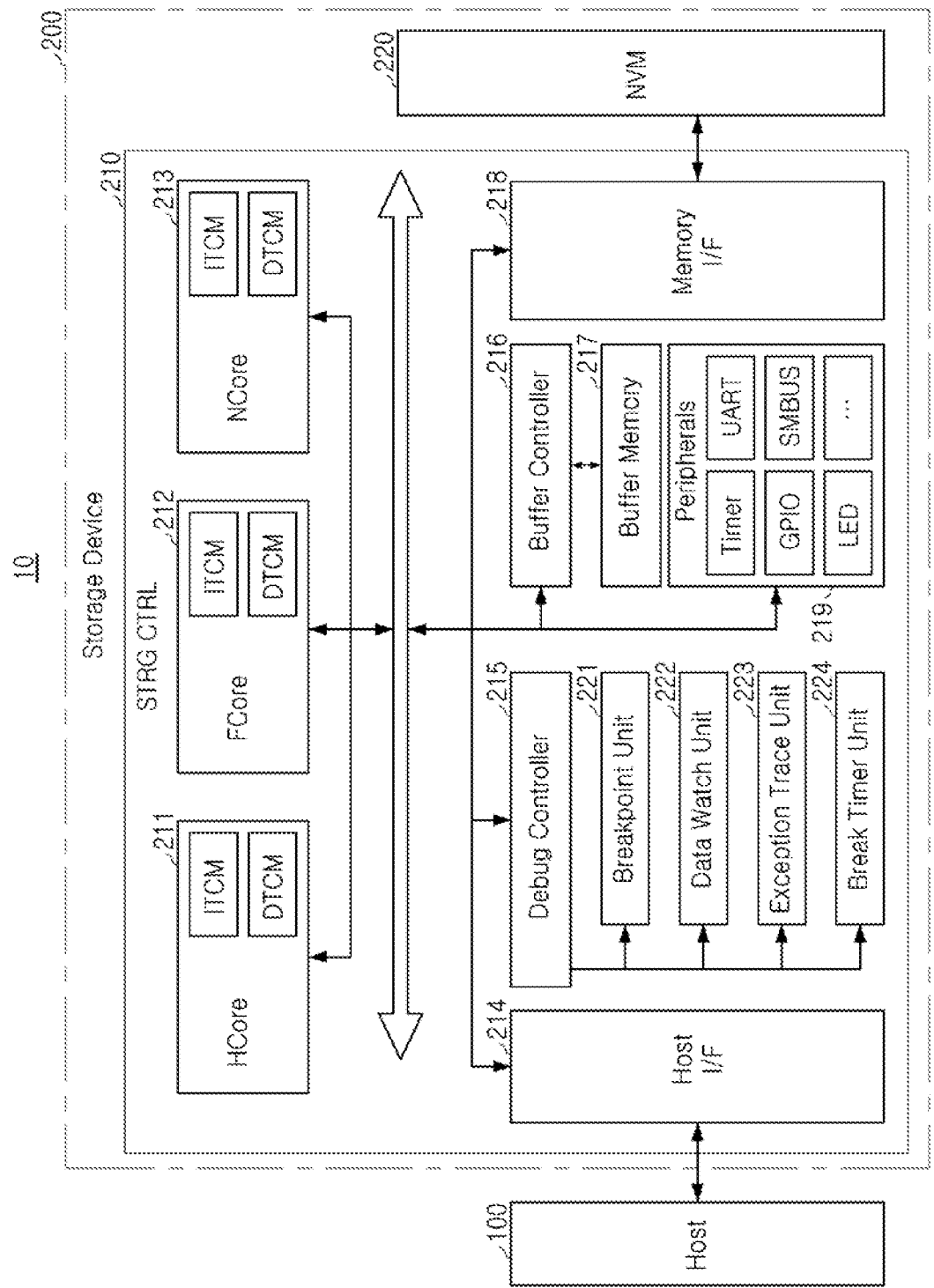
FIG. 1 is a block diagram of a host-storage system according to an embodiment.

Hereinafter, example embodiments will be described with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

At least one of the components, elements, modules or units (collectively "components" in this paragraph) represented by a block in the drawings may be embodied as various numbers of hardware, software and/or firmware structures that execute respective functions described above, according to an example embodiment. According to example embodiments, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors. Furthermore, the components represented by a block or processing steps may employ any number of related art techniques for electronics configuration, signal processing and/or control, data processing and the like.

FIG. 1 is a block diagram of a host-storage system according to an example embodiment.

The host-storage system 10 may include a host 100 and a storage device 200. Also, the storage device 200 may include a storage controller 210 and a nonvolatile memory (NVM) 220.

The host 100 may include an electronic device, such as, for example, a portable electronic device such as a mobile phone, an MP3 player, a laptop computer, and the like, or electronic devices such as a desktop computer, a gaming device, a TV, a projector, and the like. The host 100 may include at least one operating system (OS). The operating system may manage and control overall functions and operations of the host 100.

The storage device 200 may include storage media for storing data in response to a request from the host 100. As an example, the storage device 200 may include at least one of a solid-state drive (SSD), an embedded memory, and a removable external memory. When the storage device 200 is an SSD, the storage device 200 may conform to a nonvolatile memory express (NVMe) standard. When the storage device 200 is an embedded memory or an external memory, the storage device 200 may conform to a universal flash storage (UFS) or an embedded multimedia card (eMMC) standard. The host 100 and the storage device 200 may generate a packet according to an employed standard protocol and may transmit the generated packet.

The NVM 220 may retain stored data thereof even when a power supply thereof is interrupted. The NVM 220 may store data provided from the host 100 through a program operation, and may output data stored in the NVM 220 through a read operation.

When the NVM 220 of the storage device 200 includes a flash memory, the flash memory may include a 2D NAND memory array or a 3D (or vertical) NAND (VNAND) memory array. As another example, the storage device 200 may include other various types of nonvolatile memories. For example, the storage device 200 may include a magnetic RAM (MRAM), a spin-transfer torque MRAM (MRAM), a conductive bridging RAM (CBRAM), a ferroelectric RAM (FeRAM), a phase RAM (PRAM), a resistive memory (resistive RAM), and various other types of memory.

The storage controller 210 may control the NVM 220 in response to a request from the host 100. For example, the storage controller 210 may provide data read from the NVM 220 to the host 100, and may store the data provided from the host 100 in the NVM 220. To perform such operations, the storage controller 210 may support operations such as read, program, and erase operations of the NVM 220.

The storage controller 210 may include a plurality of processing cores 211, 212, and 213, a host interface 214, a debug controller 215, a buffer controller 216, a buffer memory 217, a memory interface 218, and peripheral devices 219.

The host interface 214 may transmit and receive a packet to and from the host 100. A packet transmitted from the host 100 to the host interface 214 may include a command or data to be written to the NVM 220, and a packet transmitted from the host interface 214 to the host 100 may include a response to a command or data read from the NVM 220.

The memory interface 218 may transmit data to be written to the NVM 220 to the NVM 220, or may receive data read from the NVM 220. The memory interface 218 may be implemented to comply with a standard protocol such as a toggle or an open NAND flash interface (ONFI).

The processing cores 211, 212, and 213 may control the overall operation of the storage device 200. For example, the processing cores 211, 212, and 213 may include a host interface layer (Hit) core 211, a flash translation layer (FTL) core 212, and an NVM core 213. Each of the processing cores 211, 212, and 213 may include an instruction tightly-coupled memory (ITCM), storing an instruction executed by each processing core, and a data tightly-coupled memory (DTCM) storing data used in each processing core.

The storage device 200 may logically include a plurality of layers. For example, the storage device 200 may include a HIL, a FTL, and a flash interface layer (FIL). Each of the HIL, FTL, and FIL may be implemented as a firmware program. The HIL core 211, FTL core 212, and NVM core 213 may execute Hit, FTL, and FIL, respectively.

The HIL may communicate with the host 100, for example, may parse a command received from the host 100 through the host interface 214 and provide a response to the command to the host 100 through the host interface 214.

The FTL may perform various functions such as address mapping, wear-leveling, and garbage collection.

The address mapping may be an operation of changing a logical address received from the host 100 into a physical address used to actually store data in the NVM 220. For example, the logical address may be a logical block address (LBA) used in a file system of the host 100.

The wear-leveling may be a technique for preventing excessive degradation of a specific block by ensuring that blocks in the NVM 220 are used uniformly, and may be implemented through a firmware technique for balancing erase counts of physical blocks, for example. The garbage collection may be a technique for securing usable capacity in the NVM 220 by copying valid data of a block to a new block and erasing an existing block.

The FIL may convert a command from the host into a command used in the NVM 220 to control program, read, and erase operations of the NVM 220.

The buffer memory 217 may temporarily store data exchanged between the host 100 and the NVM 220. For example, after buffering data received from the host 100, the buffer memory 217 may provide the buffered data to the NVM 220 or may output data read from the NVM 220 to the host 100. In addition, the buffer memory 217 may store data for driving the storage device 200. For example, the buffer memory 217 may store map data representing a mapping relationship between a logical address and a physical address.

The buffer memory 217 may be implemented as a volatile memory. For example, the buffer memory 217 may include a static random access memory (SRAM), a dynamic random access memory (DRAM), or the like. The buffer memory 217 may be provided in the storage controller 210, but may be disposed externally of the storage controller 210.

The buffer controller 216 may control data input/output of the buffer memory 217, and may detect and correct errors in data output from the buffer memory 217. When the buffer memory 217 includes an SRAM and a DRAM, the buffer controller 216 may include an SRAM controller and a DRAM controller.

The peripheral devices 219 may include various devices such as a timer, a general-purpose input/output (GPIO), a universal asynchronous receiver/transmitter (UART), a system management bus (SMBUS), and a light-emitting diode (LED).

An error may occur due to an internal fault of the storage device 200 during an operation of the storage device 200. A vendor of the storage device 200 may perform a debugging operation of parsing a cause of the error occurring in the storage device 200 and removing the fault.

When the storage device 200 satisfies a predetermined fault condition, the storage device 200 may store a snapshot, representing a current state of the storage device 200, in the NVM 220. The fault condition may be determined by a vendor, and may be included in a firmware program of the storage device 200. The snapshot may be extracted by the vendor to be used for debugging.

Even after the storage device 200 is released as a product, remaining faults which have not been corrected may remain in the storage device 200. While a user uses the storage device 200, an unexpected error may occur due to the remaining faults. It may be difficult for a vendor to parse a cause of a new error generated after the storage device 200 is released and to remove a fault. For example, the storage device 200 may store a snapshot according to a predetermined condition, but a snapshot generated according to a predetermined condition in the past may not be useful in parsing a cause of the new error.

To obtain a snapshot related to a new error, the vendor may provide the user with a firmware program, in which a new condition is inserted, such that the user may update a firmware program of the storage device 200. After reproducing the error in the storage device 200 having the updated firmware program, the vendor may extract snapshot information from the storage device 200 to parse the error. However, when the vendor repeatedly generates a new firmware program until a cause of the error is found and the user should repeatedly request update of the firmware program of the storage device 200, it may take a large amount of time for debugging.

According to an example embodiment, the host 100 may provide a fault insertion command to the storage device 200 to add a fault condition in which the storage device 200 is to store the snapshot. The fault insertion command may be provided to the storage device 200 based on an interface protocol employed by the host 100 and the storage device 200.

The debug controller 215 may parse the fault insertion command received from the host 100 and may perform various types of fault detection operations based on a command parsing result.

The debug controller 215 may support a fault detection operation such as an assert code execution operation, a memory polling operation, an interrupt polling operation, a latency detection operation, or the like. The debug controller 215 may drive a breakpoint unit 221, a data watch unit 222, an exception trace unit 223, a break timer unit 224, and the like, to support various types of fault detection operation. For example, the debug controller 215 may be implemented as a processing core, and the units 221 to 224 may be implemented as firmware programs to be executed in the processing core. When a debug controller is implemented as a processing core, the debug controller may be referred to as a debugging core. A fault detection operation, which may be performed by each of the units 221 to 224, will be described in detail later.

According to an example embodiment, the vendor may easily add a fault condition using a command based on an interface protocol without updating the entire firmware program of the storage device 200, and an error unexpected at the time of development of the storage device 200 may be easily parsed.

According to an example embodiment, the storage device 200 may support various types of fault detection operation to detect a condition for a snapshot, and may perform a fault detection operation on various target locations of the processing cores 211, 212, and 213 and the buffer memory 217 of the storage device 200. The vendor may effectively parse a cause of the unexpected error using snapshots collected in the storage device 200 under various conditions.

Hereinafter, an example of an interface protocol employed by the host 100 and the storage device 200 will be described before an example embodiment is described in detail.

Figure 2:
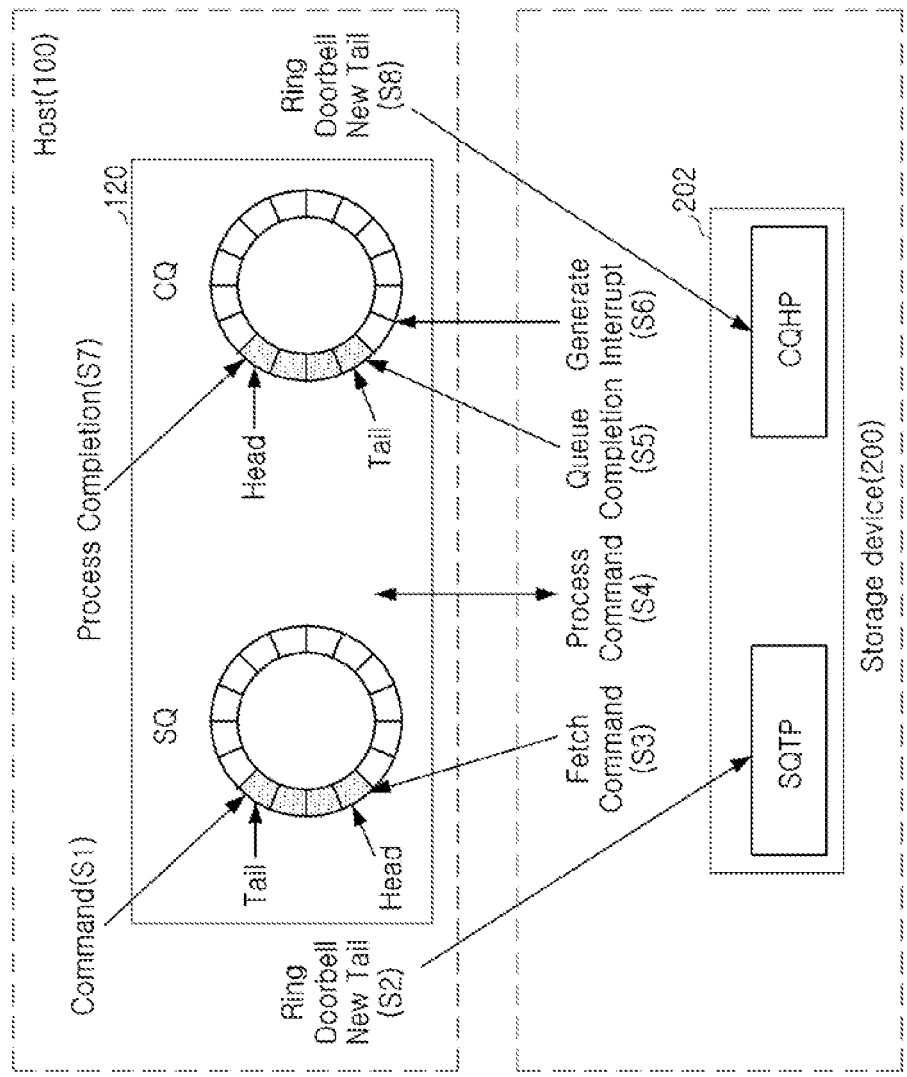
FIG. 2 is a diagram illustrating an interface protocol between a host and a storage device.

FIG. 2 is a diagram illustrating an interface protocol between a host and a storage device.

FIG. 2 illustrates a host 100 and a storage device 200. The host 100 and the storage device 200 illustrated in FIG. 2 correspond to the host 100 and the storage device 200 described with reference to FIG. 1, respectively.

The host 100 may communicate with the storage device 200 using a command queue interface supporting a protocol such as a nonvolatile memory express (NVMe). The command queue interface may support interfacing between the host 100 and the storage device 200 using a queue pair including a submission queue SQ for inputting a requested command and a completion queue CQ for writing a processing result of the command.

The host 100 may generate a queue pair. According to implementation, the queue pair may be stored in a host memory 120.

The storage device 200 may include a doorbell register 202 to perform a command queue interface operation. The doorbell register 202 may be a register for controlling a queue pair generated by the host 100. The doorbell register 202 may store a submission queue tail pointer SQTP and a completion queue head pointer CQHP.

As shown in FIG. 2, in operation S1, the host 100 may queue a command to the submission queue SQ to request the storage device 200 to execute the command. In operation S2, the host 100 may update the submission queue tail pointer SQTP and may provide the updated submission queue tail pointer SQTP to the storage device 200. The storage device 200 may store the updated submission queue tail pointer SQTP in the doorbell register 202.

In operation S3, the storage device 200 may fetch a command from the submission queue SQ. In operation S4, the storage device 200 may process the fetched command.

In operation S5, after processing the command, the storage device 200 may write completion of processing of the command to the completion queue CQ. For example, the storage device 200 may write a completion queue entry to the completion queue CQ. In this case, the completion queue head pointer CQHP may be increased. In operation S6, the storage device 200 may generate an interrupt signal.

In operation S7, the host 100 may complete the command. In operation S8, the host 100 may provide the updated completion queue head pointer CQHP to the storage device 200. The storage device 200 may store the updated completion queue head pointer CQHP in the doorbell register 202.

According to an example embodiment, the host 100 may provide a fault insertion command to the storage device 200 using an interface protocol as described with reference to FIG. 2 to insert various fault conditions for a snapshot operation into the storage device 200. Hereinafter, operations of the host-storage system according to an example embodiment will be described in detail with reference to FIGS. 3 to 15.

Figure 3:
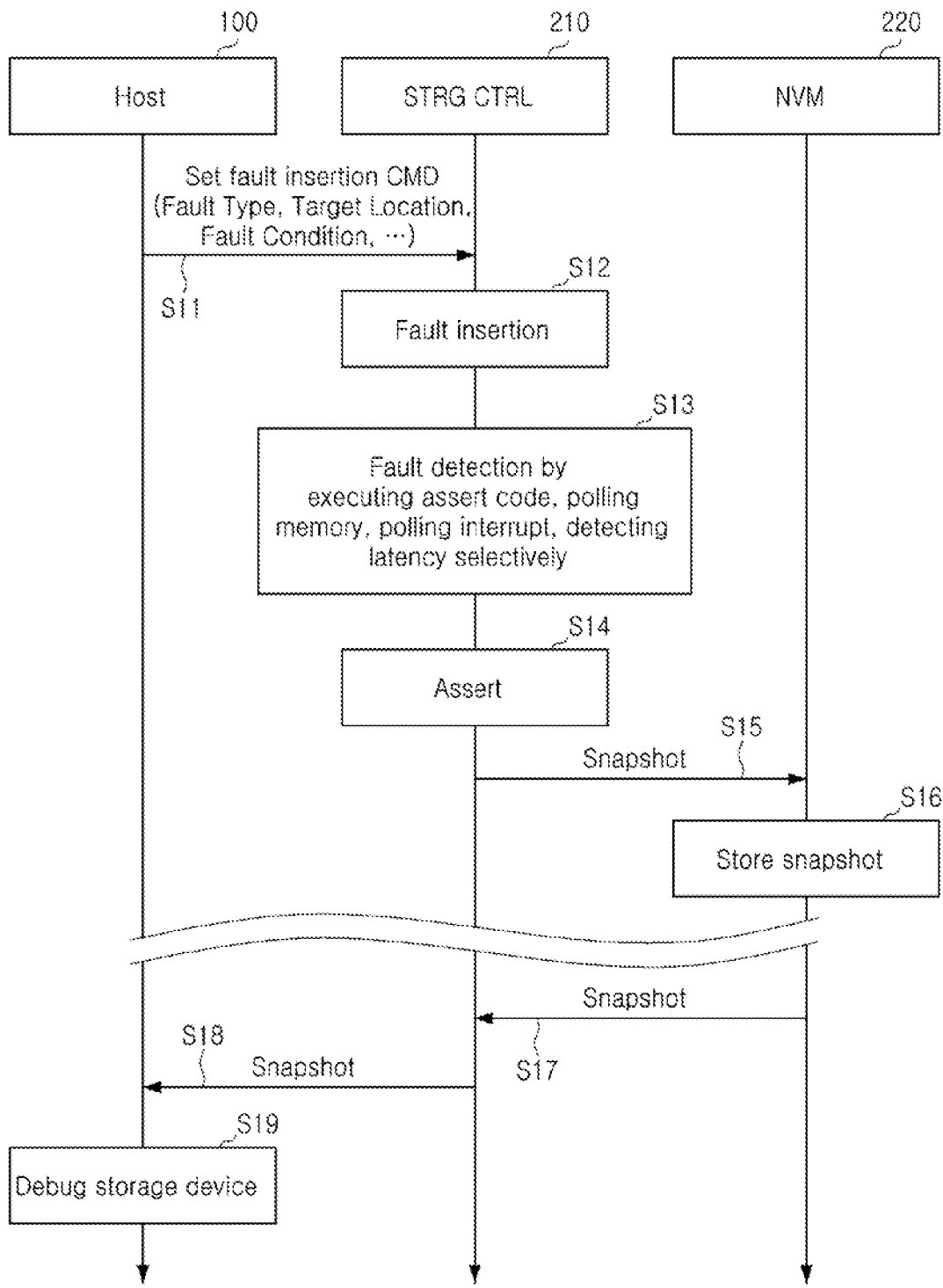
FIG. 3 is a flowchart illustrating operations of a host-storage system according to an embodiment.

FIG. 3 is a flowchart illustrating operations of a host-storage system according to an example embodiment.

In operation S11, the host 100 may provide a fault insertion command, including a snapshot condition to be added, to the storage controller.

For example, the fault insertion command may include a fault type, a target location, and a fault condition.

In operation S12, the storage controller 210 may parse the fault insertion command from the host 100 and may insert a fault condition based on the fault type, fault location, and fault condition.

In operation S13, the storage controller 210 may perform a fault detection operation, selected depending on the fault type, from among various types of fault detection operation such as an assert code execution operation, a memory polling operation, an interrupt polling operation, and a latency detection operation. For example, the fault detection operation may be performed by the debug controller 215.

The storage controller 210 may perform a fault detection operation by determining whether a fault condition is satisfied in a target location of the storage device.

When the fault condition is satisfied in the storage device 200, the storage controller 210 may trigger an assert in operation S14.

When the assertion is triggered, the storage controller 210 may stop an operation which is being performed and may generate a snapshot including current state information of the storage device 200. For example, the storage controller 210 may generate a snapshot based on data stored in ITCMs, DTCMs, and the buffer memory 217.

In operation S15, the storage controller 210 may provide the generated snapshot to a nonvolatile memory. In operation S16, the NVM 220 may store the snapshot. For example, the operations of generating the snapshot and providing the generated snapshot to the NVM may be performed by the plurality of processing cores 211, 212, and 213.

The snapshot stored in the NVM 220 may be retained even when power is not supplied to the storage device 200. Accordingly, the host 100 may extract the snapshot even after the storage device 200 is finished, e.g., even after power supply to the storage device 200 is cut off.

The host 100 may obtain the snapshot stored in the NVM 220 in operations S17 and S18. For example, the host 100 may obtain a snapshot based on an interface protocol with the storage device 200.

In operation S19, the host 100 may correct a fault in the storage device 200 by performing debugging of the storage device 200 using the snapshot obtained under the fault condition.

Hereinafter, various examples of fault detection operations depending on types of fault will be described with reference to FIGS. 4 to 15.

FIGS. 4 to 6B are diagrams illustrating a first example of a fault detection operation.

Figure 4:
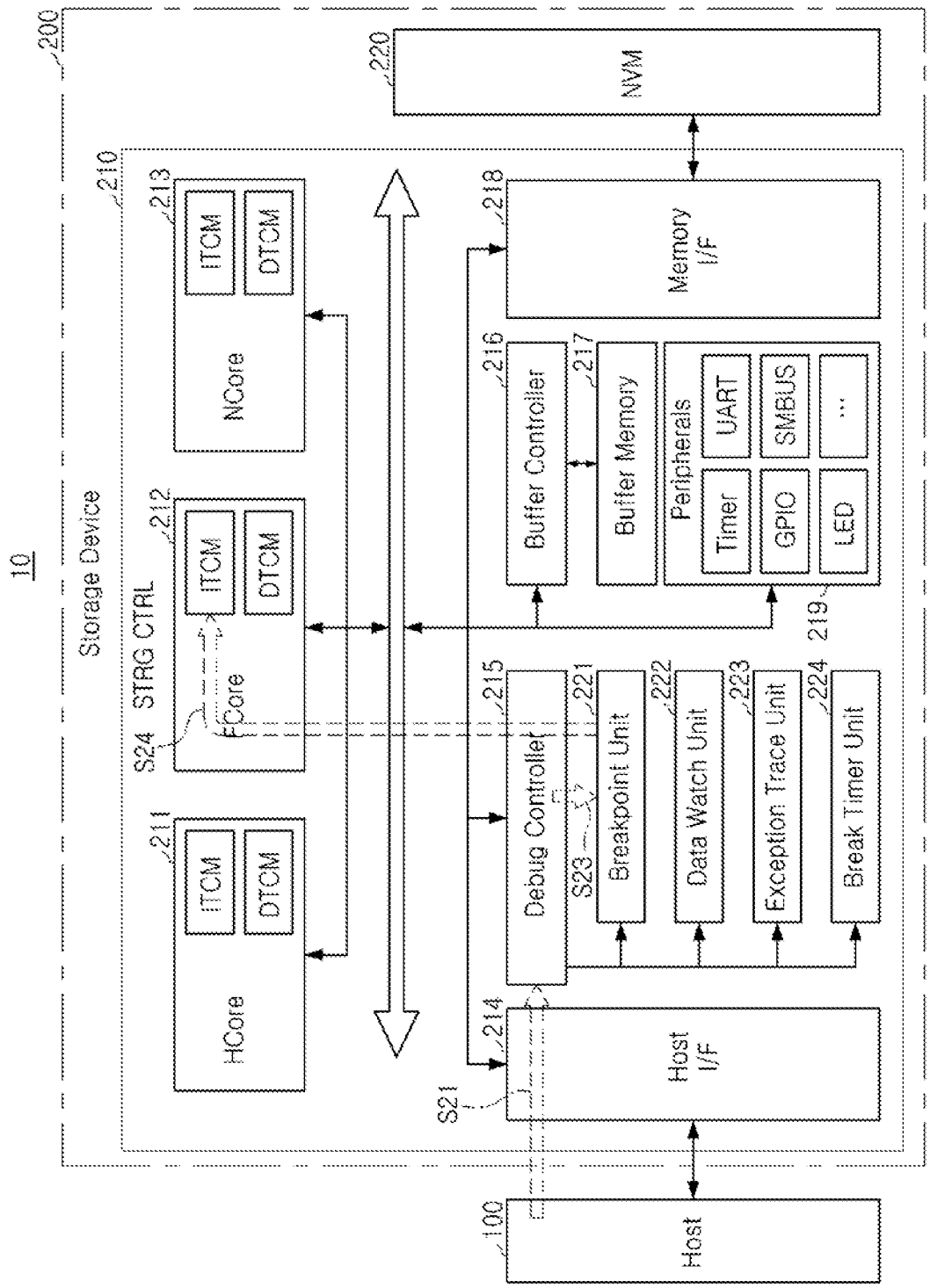
Figure 5:
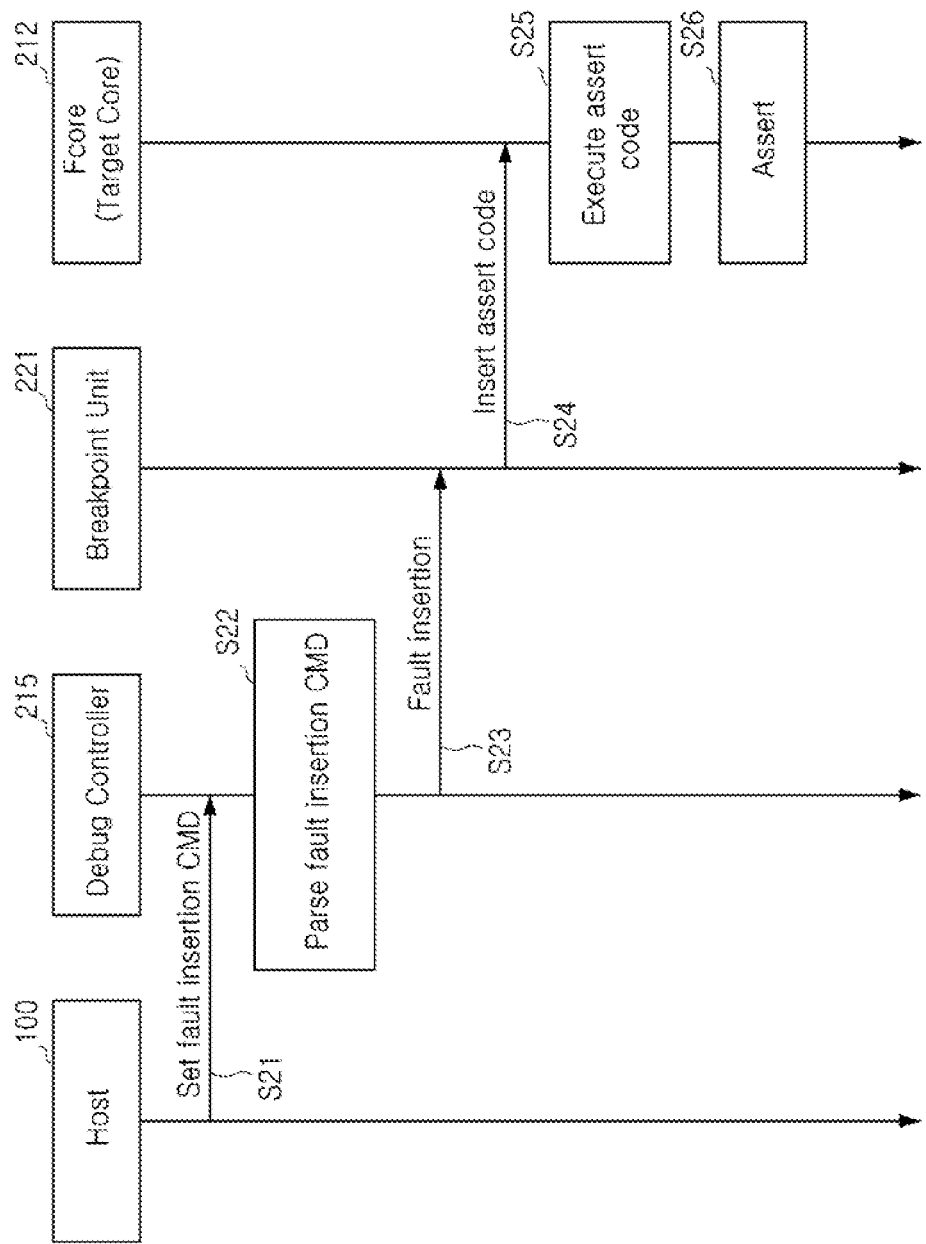

FIGS. 4 and 5 are diagrams illustrating interactions of components included in the host-storage system in the first example of the fault detection operation. In FIG. 4, interactions of components on the host-storage system 10 illustrated in FIG. 1 are briefly illustrated with arrows. In FIG. 5, operations of the components interacting with each other are illustrated in greater detail.

Referring to FIGS. 4 and 5, in operation S21, the host 100 may provide a fault insertion command to the debug controller 215 through the host interface 214.

Referring to FIG. 5, in operation S22, the debug controller 215 may parse the fault insertion command.

The fault insertion command may include various parameters including a fault type, a target location, and a fault condition. FIG. 6A illustrates a first table TABLE1 representing various parameters which may be included in a fault insert command.

The fault type may represent the type of fault detection operation to be performed by the fault insertion command. In the example of FIG. 6A, the fault type may specify an assert code execution operation.

The assert code is a type of source code included in a firmware program, and may refer to a code inserted into a point, at which a firmware program is expected to have a fault, to determine whether an error occurs at the point. For example, the storage device 200 may sequentially execute source codes included in the firmware program. A value of a register, included in a processing core, may vary depending on an execution result of the source codes. For example, if an error may occur in the storage device 200 when a register has a specific value, the assert code may be a code for checking whether the value of the register depending on the execution result of the source codes corresponds to the specific value.

When the fault type is an assert code execution type, the fault insertion command may include a target core, a target address, and a fault condition.

The target core may indicate where the asserted code is inserted into the firmware program executed in one of the plurality of processing cores 211, 212, and 213. In the example of FIG. 6A, the target core may be an FTL core 212. When the target core is the FTL core 212, the assert code may be inserted into an ITCM of the FTL core 212.

The target address may represent a detailed address into which the assert code is to be inserted in the ITCM of the target core.

The fault condition may represent a detailed condition to be inserted as an assert code. In the example of FIG. 6A, the fault condition may include first to third conditions Condition1 to Condition3. The first condition Condition1 may represent a register identifier, the second condition Condition2 may represent a comparison operator, and the third condition Condition3 may represent a specific value which may be a value of a register. In the case in which the first condition is "Register1," the second condition is "≠," and the third condition is "0x5," the fault condition may be satisfied when a value of the first register Register1 is not (≠) a specific value "0x5."

Referring to FIGS. 4 and 5, the debug controller 215 may control fault insertion of a selected unit, among the various units 221 to 224, based on a parsing result of the fault insertion command in operation S23.

As described in the example of FIG. 6A, when a fault type of the fault insertion command is determined to be an assert code execution type, the debug controller 215 may control the breakpoint unit 221 to perform the assert code insertion.

Referring to FIGS. 4 and 5, in operation S24, the breakpoint unit 221 may insert an assert code into an ITCM of a target core, for example, the FTL core 212.

Figure 6B:
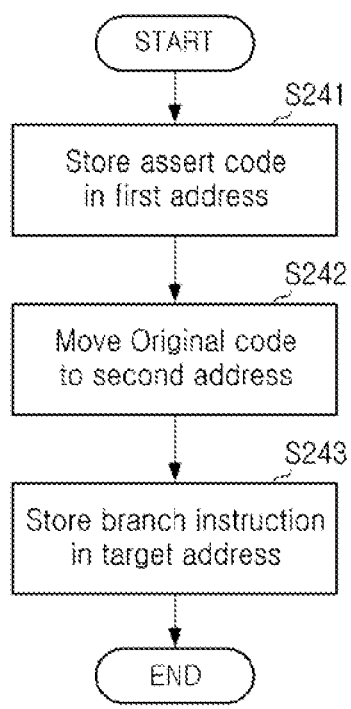

FIG. 6B is a flowchart illustrating an example of a method of inserting an assert code into a target region indicated by a target address of an ITCM of a target core.

The breakpoint unit 221 may replace an original code, stored in the target region of the ITCM, with an assert code by performing operations S241 to S243.

In operation S241, the breakpoint unit 221 may store the assert code in an empty region of the ITCM. For example, the assert code may be stored in a region (e.g., a first empty region) indicated by a first address.

In operation S242, the breakpoint unit 221 may move the original code, stored in the target region of the ITCM, to the empty region of the ITCM and may store the moved original code in the empty region. For example, the original code may be stored in a region (e.g., a second empty region) indicated by a second address.

In operation S243, the breakpoint unit 221 may insert a branch instruction into the target region. For example, an instruction branching from the target address to the first address may be inserted to execute the assert code when the target region is accessed.

When debugging of the storage device 200 is finished, a command branching to a second address may be inserted into the target region to execute the original code when the target region is accessed.

Referring to FIG. 5, in operation S25, the FTL core 212 may execute the assert code.

For example, the FTL core 212 may execute the assert code at the target address while executing source codes loaded in the ITCM in the order of addresses. The FTL core 212 may determine whether a value stored in the first register by previously executed source codes is not "0x5," based on the fault condition included in the assert code.

In operation S26, the FTL core 212 may trigger an assert when the value stored in the first register is not "0x5." As described with reference to operations S14 and S15 of FIG. 3, when an assert is triggered, the storage controller 210 may generate a snapshot and store the generated snapshot in the NVM 220.

Figure 7:
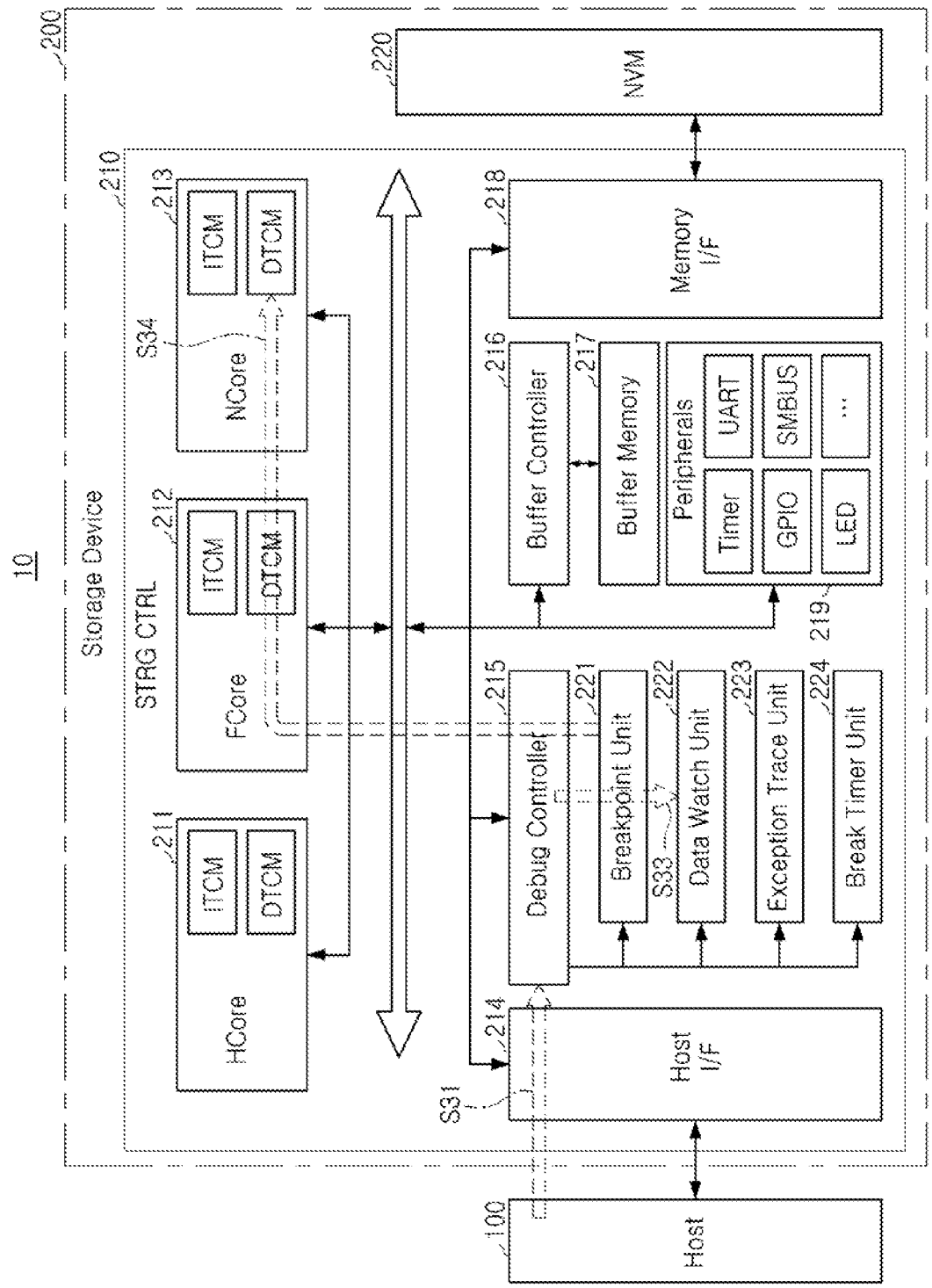
Figure 8:
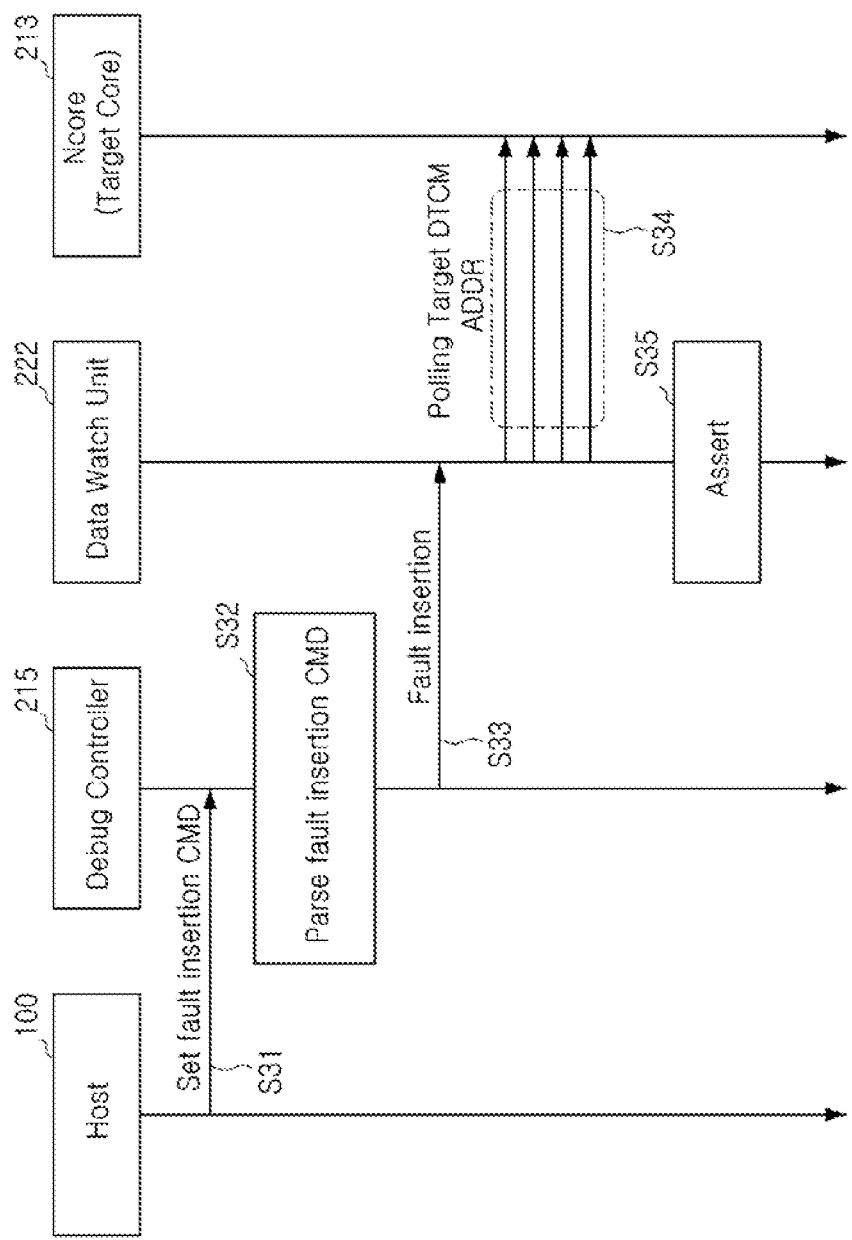

FIGS. 7 to 9 are diagrams illustrating a second example of a fault detection operation.

In FIG. 7, interactions of components on the host-storage system 10 illustrated in FIG. 1 are briefly illustrated with arrows. In FIG. 8, operations of the components interacting with each other are illustrated in greater detail. FIG. 9 illustrates a second table TABLE2 representing various parameters which may be included in a fault insert command.

Referring to FIGS. 7 and 8, in operation S31, the host 100 may provide a fault insertion command to the debug controller 215 through the host interface 214.

Referring to FIG. 8, in operation S32, the debug controller 215 may parse a fault insertion command.

Referring to FIG. 9, the fault type may designate a memory polling operation. The memory polling operation may refer to an operation of testing data stored in a region indicated by a target address in a memory included in the storage controller 210.

When the fault type is a memory polling type, the fault insert command may include a target core, a target address, and a fault condition.

The target core may indicate which core, among the plurality of processing cores 211, 212, and 213, a DTCM is to be polled. In the example of FIG. 9, the target core may be the NVM core 213.

The target address may indicate a specific address of a target area to be polled in the DTCM of the target core.

The fault condition may indicate what value of data, stored in the target address as a result of a memory polling operation, is used to determine that the storage device 200 has a fault. In the example of FIG. 9, the fault condition may include first and second conditions Condition1 and Condition2. The first condition Condition1 may present a comparison operator, and the second condition Condition2 may represent a data value which may be stored in the memory. When the first condition is "==" and the second condition is "0x100," the fault condition may be satisfied when data stored in the target area is equal to (—) a specific data value "0x100."

Referring to FIGS. 7 and 8, in operation S33, the debug controller 215 may control the fault insertion of a selected unit, among the various units 221 to 224, based on a parsing result of the fault insertion command.

As described in the example of FIG. 9, when the fault type of the fault insertion command is determined to be a memory polling type, the debug controller 215 may control the data watch unit 222 to perform memory polling.

In operation S34, the data watch unit 222 may periodically poll the target region indicated by the target address in the DTCM of the target core. The data watch unit 222 may determine whether a value, stored in a target region indicated by a target address "0x2AAE6818," is equal to "0x100" based on the fault condition.

In operation S35, the data watch unit 222 may trigger an assert when the value stored in the target region is "0x100." In addition, the storage controller 210 may generate a snapshot and store the generated snapshot in the NVM 220.

When the fault type is the memory polling type, an example embodiment has been described with respect to the case in which the data watch unit 222 polls a DTCM of a core, among the plurality of processing cores 211, 212, and 213, but example embodiments are not limited thereto. For example, the host 100 may request the storage device 200 to poll data of the buffer memory 217 rather than the DTCM of the target core. When the host 100 requests data of the buffer memory 217 to be polled, parameters of the fault insertion command may include the target memory rather than the target core.

Figure 10:
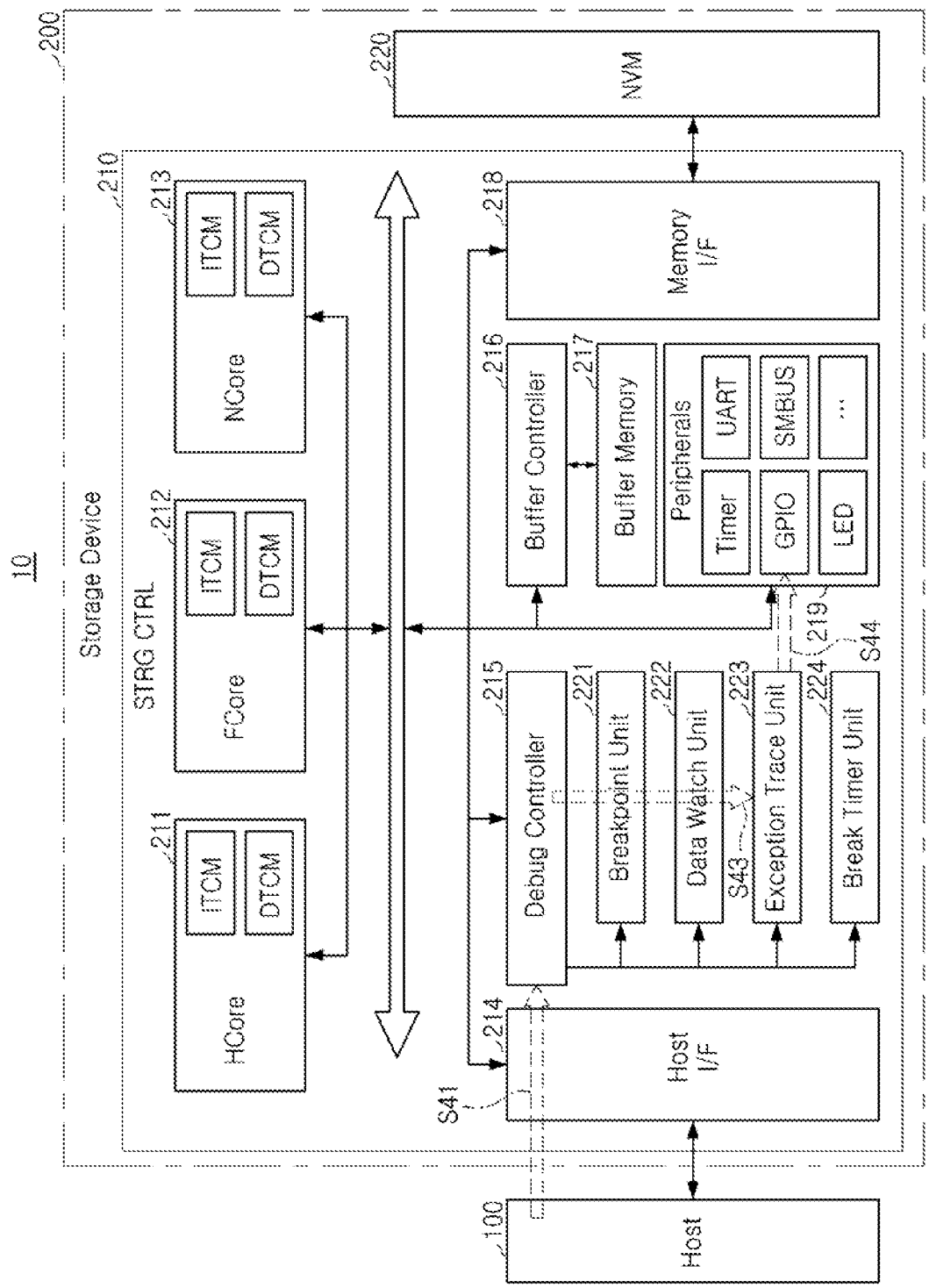
Figure 11:
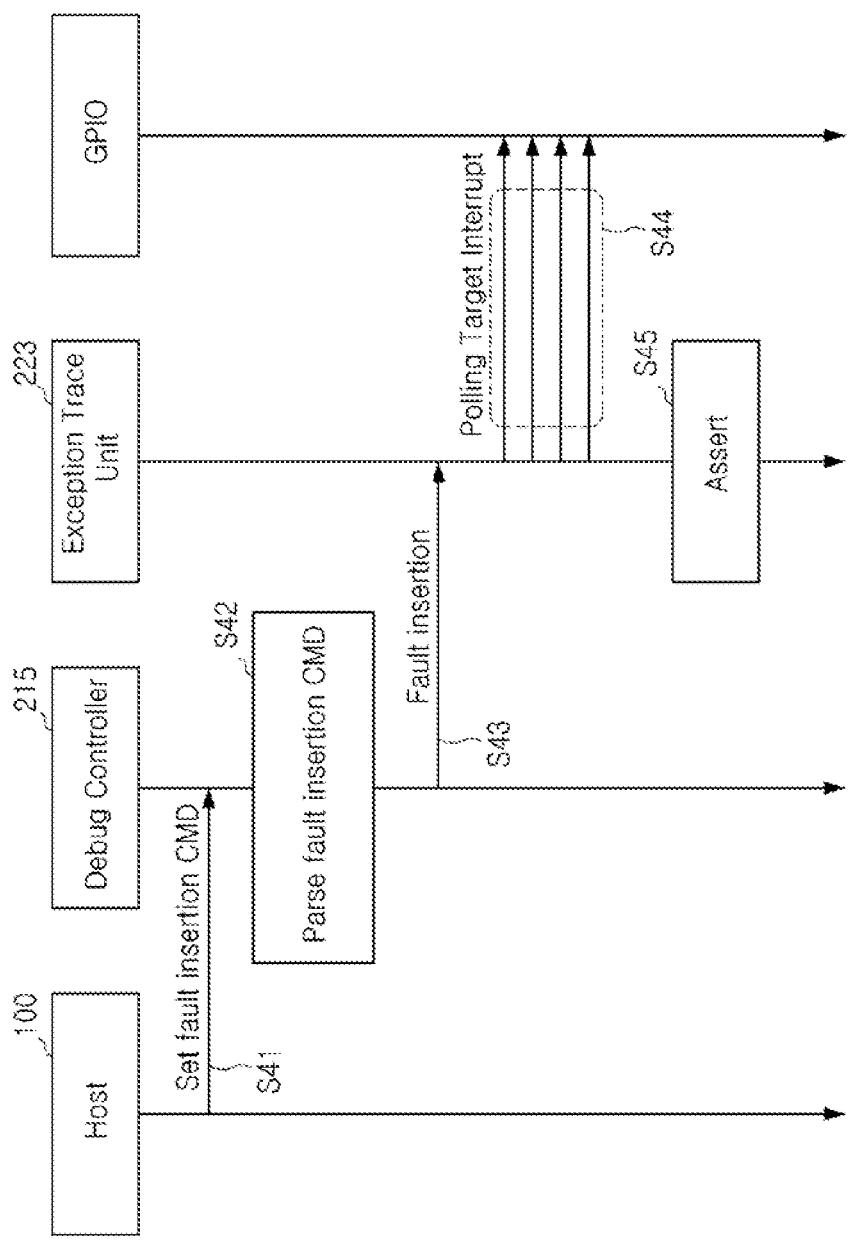

FIGS. 10 to 12 are diagrams illustrating a third example of a fault detection operation.

In FIG. 10, interactions of components on the host-storage system 10 illustrated in FIG. 1 are briefly illustrated with arrows. In FIG. 11, operations of the components interacting with each other are illustrated in greater detail. FIG. 12 illustrates a third table TABLE3 representing various parameters which may be included in a fault insert command.

Referring to FIGS. 10 and 11, in operation S41, the host 100 may provide a fault insertion command to the debug controller 215 through the host interface 214.

Referring to FIG. 11, in operation S42, the debug controller 215 may parse the fault insertion command.

Referring to FIG. 12, the fault type may designate an interrupt polling operation. The interrupt polling operation may refer to an operation of checking whether an interrupt generated by the storage controller 210 satisfies a predetermined condition.

When the fault type is an interrupt polling type, the fault insertion command may include a target core and a fault condition.

Various types of interrupt may occur in the storage controller 210. For example, the interrupt may occur in hardware from a GPIO or may occur in software from the buffer controller 216 when error correction of the buffer memory 217 fails. An interrupt occurring in the storage controller 210 may be processed by one of the plurality of processing cores 211, 212, and 213.

The fault condition may specify the type of interrupt (e.g., a fault condition interrupt). In the example of FIG. 12, the fault condition may include first and second conditions Condition1 and Condition2. The first condition Condition1 may represent an interrupt occurrence type, and the second condition Condition2 may represent a pin number at which the interrupt occurs. In the case in which the first condition is "GPIO" and the second condition is "5," when an interrupt occurs in a fifth pin of the GPIO as a result of polling interrupts, it may be determined that the storage device 200 has a fault.

The target core may specify which processing core, among the plurality of processing cores 211, 212, and 213, receives and processes an interrupt corresponding to the fault condition.

Referring to FIGS. 10 and 11, in operation S43, the debug controller 215 may control fault insertion of a selected unit, among the various units 211 to 214, based on a parsing result of the fault insertion command.

As described in the example of FIG. 12, when the fault type of the fault insertion command is determined to be an interrupt polling type, the debug controller 215 may control the exception trace unit 223 to perform interrupt polling.

In operation S44, the exception trace unit 223 may poll the interrupt occurring in the GPIO. The exception trace unit 223 may detect an interrupt occurring at the fifth pin based on the fault condition.

In operation S45, the exception trace unit 223 may trigger an assert when occurrence of an interrupt in the fifth pin is detected. In addition, the storage controller 210 may generate a snapshot and store the generated snapshot in the NVM 220.

Figure 13:
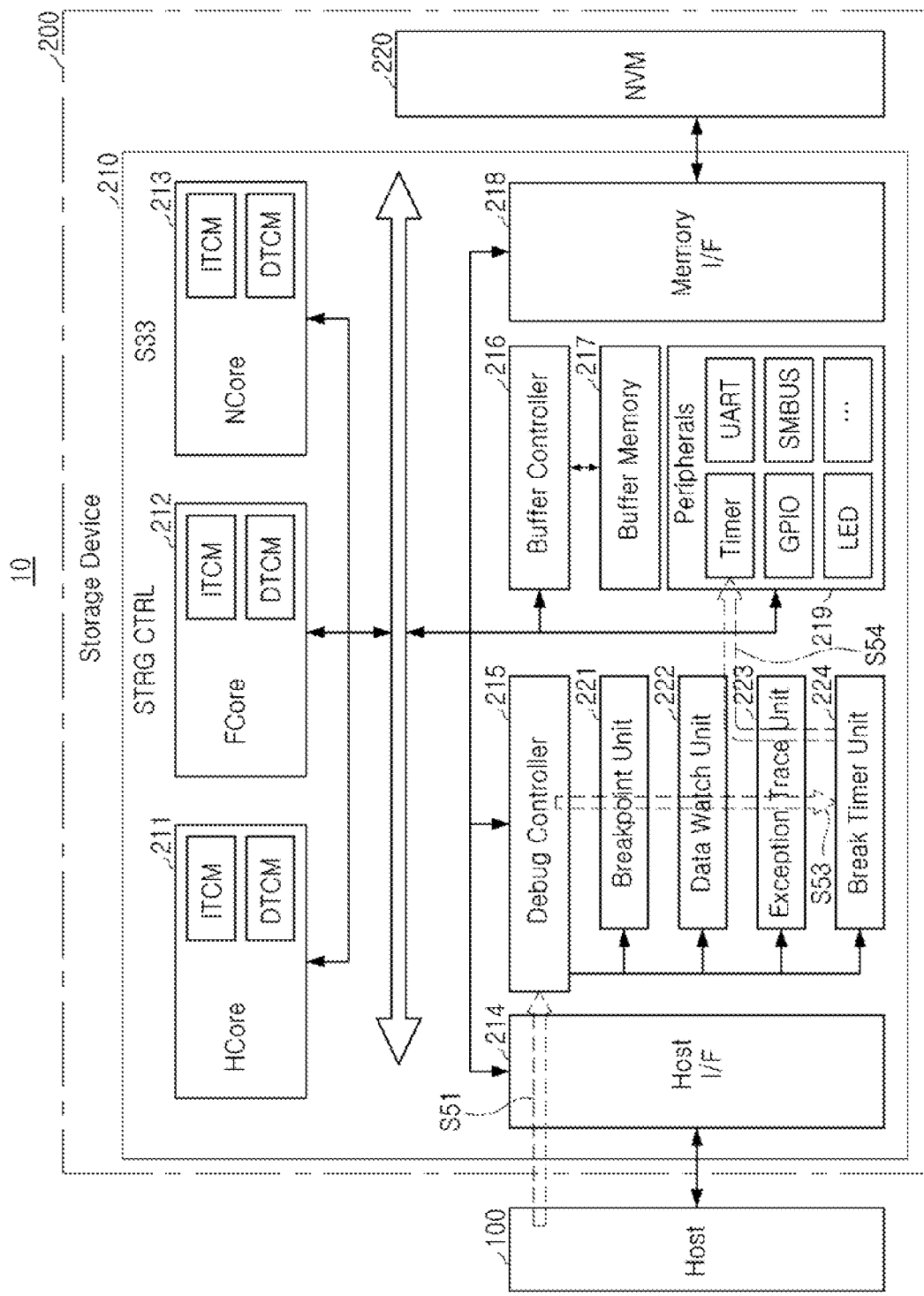
Figure 14:
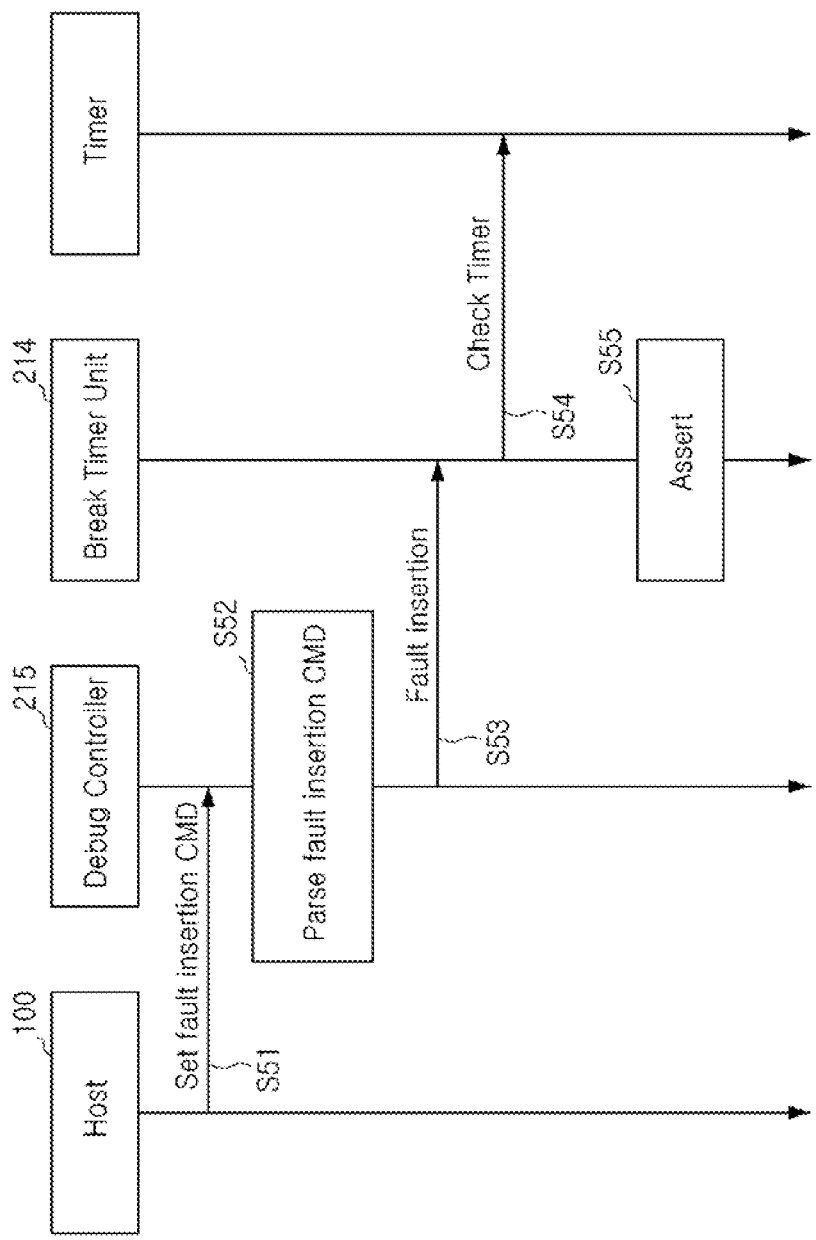

FIGS. 13 to 15 are diagrams illustrating a fourth example of a fault detection operation.

In FIG. 13, interactions of components on the host-storage system 10 illustrated in FIG. 1 are briefly illustrated with arrows. In FIG. 14, operations of the components interacting with each other are illustrated in greater detail. FIG. 15 illustrates a fourth table TABLE4 representing various parameters which may be included in a fault insert command.

Referring to FIGS. 13 and 14, in operation S51, the host 100 may provide a fault insertion command to the debug controller 215 through the host interface 214.

Referring to FIG. 14, in operation S52, the debug controller 215 may parse the fault insertion command.

Referring to FIG. 15, the fault type may specify a latency detection operation. The latency detection operation may refer to an operation of comparing latency of an operation, performed by the storage controller 210, with a predetermined value.

When the fault type is a latency detection type, the fault insertion command may include a target core, a target operation, and a fault condition.

The processing cores 211, 212, and 213 of the storage controller 210 may perform operations in response to various commands, such as read, write, and trim commands, from the host 100. A specification of the storage device 200, or the like, mandates that a command should be processed within a predetermined time after a command is received from the host 100. Among the peripheral devices 219, a timer may measure the time required for the processing cores 211, 212, and 213 to perform an operation. The target core may indicate which of the processing cores 211, 212, and 213 for which an operating time is measured, and may indicate which of the various operations of which an operating time is measured. In the example of FIG. 15, the target core may be the FTL core 212, and the target operation may be a read operation.

The fault condition may indicate a value of time required for a target operation of the target core to determine whether the storage device 200 has a fault. In the example of FIG. 15, the fault condition may include first to third conditions Condition1, Condition2, and Condition3. The first condition Condition1 may represent a required time value, the second condition Condition2 may represent a unit of the required time, and the third condition Condition3 may represent a comparison operator. When the first condition is "500," the second condition is "µs," and the third condition is ">," the fault condition may be satisfied when time required for the FTL core 212 to process a read operation is greater than 500 µs.

Referring to FIGS. 13 to 14, in operation S53, the debug controller 215 may control the fault insertion of a selected unit, among the various units 221 to 224, based on a parsing result of the fault insertion command.

As in the example of FIG. 15, when the fault type of the fault insertion command is determined to be a latency detection type, the debug controller 215 may control the break timer unit 224 to perform latency detection.

In operation S54, the break timer unit 224 may monitor the break timer unit 224 to determine whether time required for the FTL core 212 to process the read operation is larger than 500 μs.

In operation S55, when the time required for the FTL core 212 to process the read operation is detected to be larger than 500 μs, the break timer unit 224 may generate an assert signal indicating that the storage device 200 has a fault. In addition, the storage controller 210 may generate a snapshot and store the generated snapshot in the NVM 220.

According to an example embodiment, the storage device 200 may store snapshots, generated under various fault conditions detected by various fault detection operations according to a fault insertion command from the host 100, in the NVM 220. The host 100 may provide a command depending on an interface protocol with the storage device 200 to easily add a fault condition. In addition, a vendor may effectively debug unexpected errors using the snapshots obtained through the host 100.

Hereinafter, a structure of a memory device, to which an example embodiment may be applied, and an example of a system, to which an example embodiment may be applied will be described with reference to FIGS. 16 to 18.

Figure 16:
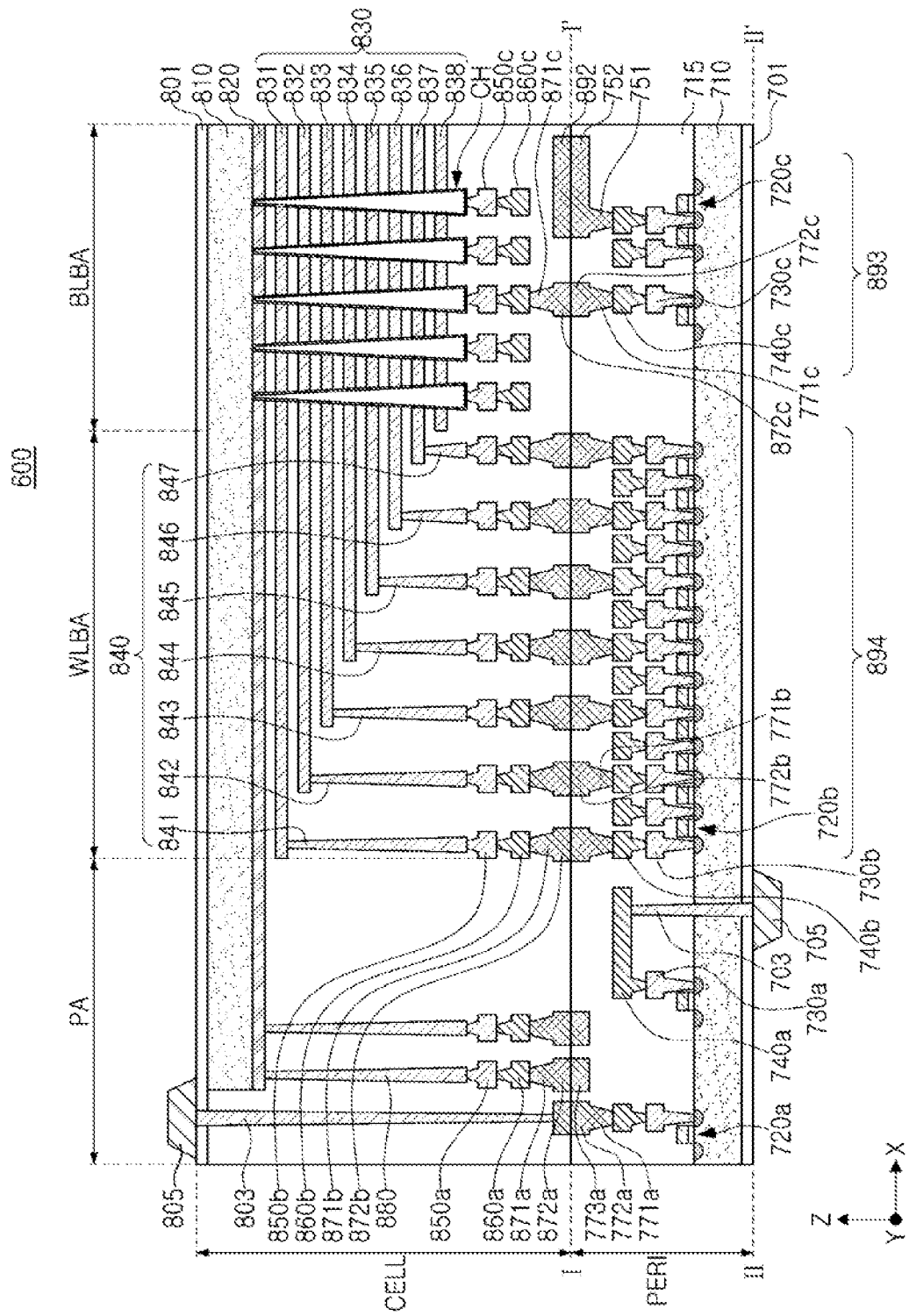
FIGS. 16 to 18 are diagram illustrating examples of a structure of a memory device, to which example embodiments may be applied, and a system to which example embodiments may be applied.

FIG. 16 is a cross-sectional view of a memory device according to an example embodiment.

Referring to FIG. 16, a memory device 600 may have a chip-to-chip (C2C) structure. In the C2C structure, an upper chip including a cell region CELL may be manufactured on a first wafer, a lower chip including a peripheral circuit region PERI may be manufactured on a second wafer different from the first wafer, and the upper chip and the lower chip may be connected to each other by a bonding method. For example, the bonding method may refer to a method of electrically connecting a bonding metal, formed in an uppermost metal layer of the upper chip, to a bonding metal formed in an uppermost metal layer of the lower chip. For example, when the bonding metal is formed of copper (Cu), the bonding method may be a Cu-to-Cu bonding method, and the bonding metal may be formed of aluminum or tungsten.

Each of the peripheral circuit region PERI and the cell region CELL of the memory device 600 may include an external pad bonding region PA, a word line bonding region WLBA, and a bit line bonding region BLBA. The peripheral circuit region PERI may include a first substrate 710, an interlayer insulating layer 715, a plurality of circuit devices 720a, 720b, and 720c formed on the first substrate 710, first metal layers 730a, 730b, and 730c connected to the plurality of circuit devices 720a, 720b, and 720c, and second metal layers 740a, 740b, and 740c formed on the first metal layers 730a, 730b, and 730c. In an example embodiment, the first metal layers 730a, 730b, and 730c may be formed of tungsten having relatively high resistance, and the second metal layers 740a, 740b, and 740c may be formed of copper having relatively low resistance.

In an embodiment, only the first metal layers 730a, 730b, and 730c and the second metal layers 740a, 740b, and 740c are illustrated and described, but example embodiments are not limited thereto, and at least one metal layer may be further formed on the second metal layers 740a, 740b, and 740c. At least a portion of the one or more metal layers formed on the second metal layers 740a, 740b, and 740c may be formed of aluminum having resistance lower than that of copper forming the second metal layers 740a, 740b, and 740c.

The interlayer insulating layer 715 may be disposed on the first substrate 710 to cover the plurality of circuit devices 720a, 720b, and 720c, the first metal layers 730a, 730b, and 730c, and the second metal layers 740a, 740b, and 740c and may include an insulating material such as a silicon oxide or a silicon nitride.

Lower bonding metals 771b and 772b may be formed on the second metal layer 740b of the word line bonding region WLBA. In the word line bonding region WLBA, the lower bonding metals 771b and 772b of the peripheral circuit region PERI may be electrically connected to the upper bonding metals 871b and 872b of the cell region CELL by a bonding method, and the lower bonding metals 771b and 772b and the upper bonding metals 871b and 872b may be formed of aluminum, copper, tungsten, or the like. The upper bonding metals 871b and 872b of the cell region CELL may be referred to as first metal pads, and the lower bonding metals 771b and 772b of the peripheral circuit region PERI may be referred to as second metal pads.

The cell region CELL may provide at least one memory block. The cell region CELL may include a second substrate 810 and a common source line 820. A plurality of word lines 831 to 838 (830) may be stacked on the second substrate 810 in a direction (a Z-axis direction), perpendicular to the upper surface of the second substrate 810. String select lines and a ground select line may be disposed above and below the word lines 830, and a plurality of word lines 830 may be disposed between the string select lines and the ground select line.

In the bit line bonding region BLBA, the channel structure CH may extend in a direction perpendicular to the upper surface of the second substrate 810 and may penetrate the word lines 830, the string selection lines, and the ground selection line. The channel structure CH may include a data storage layer, a channel layer, and a buried insulating layer, and the channel layer may be electrically connected to the first metal layer 850c and the second metal layer 860c. For example, the first metal layer 850c may be a bit line contact, and the second metal layer 860c may be a bit line. In an example embodiment, the bit line may extend in a first direction (a Y-axis direction), parallel to the upper surface of the second substrate 810.

In the example embodiment illustrated in FIG. 16, a region in which the channel structure CH and the bit line are disposed may be defined as the bit line bonding region BLBA. The bit line may be electrically connected to the circuit devices 720c providing the page buffer 893 in the peripheral circuit region PERI in the bit line bonding region BLBA. As an example, the bit line may be connected to the upper bonding metals 871c and 872c in the peripheral circuit region PERI, and the upper bonding metals 871c and 872c may be connected to the lower bonding metals 771c and 772c connected to the circuit devices 720c of the page buffer 893.

In the word line bonding region WLBA, the word lines 830 may extend in a second direction (an X-axis direction), parallel to the upper surface of the second substrate 810, and may be connected to a plurality of cell contact plugs 841 to 847 (840). The word lines 830 and the cell contact plugs 840 may be connected to each other in pads provided by at least a portion of the word lines 830 extending by different lengths in the second direction (the X-axis direction). A first metal layer 850b and a second metal layer 860b may be connected to the upper portions of the cell contact plugs 840 connected to the word lines 830 in sequence. In the word line bonding region WLBA, the cell contact plugs 840 may be connected to the peripheral circuit region PERI through the upper bonding metals 871*b* and 872*b* of the cell region CELL and the lower bonding metals 771*b* and 772*b* of the peripheral circuit region PERI.

The cell contact plugs 840 may be electrically connected to the circuit devices 720*b* providing the row decoder 894 in the peripheral circuit region PERI. In an example embodiment, the operating voltages of the circuit devices 720*b* providing the row decoder 894 may be different from the operating voltages of the circuit devices 720*c* providing the page buffer 893. For example, the operating voltages of the circuit devices 720*c* providing the page buffer 893 may be higher than the operating voltages of the circuit devices 720*b* providing the row decoder 894.

A common source line contact plug 880 may be disposed in the external pad bonding region PA. The common source line contact plug 880 may be formed of a metal, a metal compound, or a conductive material such as polysilicon, and may be electrically connected to the common source line 820. A first metal layer 850*a* and a second metal layer 860*a* may be stacked on the common source line contact plug 880 in sequence. For example, the region in which the common source line contact plug 880, the first metal layer 850*a*, and the second metal layer 860*a* are disposed may be defined as an external pad bonding region PA.

Input/output pads 705 and 805 may be disposed in the external pad bonding region PA. Referring to FIG. 16, a lower insulating film 701 covering the lower surface of the first substrate 710 may be formed below the first substrate 710, and first input/output pad 705 may be formed on the lower insulating film 701. The first input/output pad 705 may be connected to at least one of the plurality of circuit devices 720*a*, 720*b* and 720*c* disposed in the peripheral circuit region PERI through the first input/output contact plug 703, and may be separated from the first substrate 710 by the lower insulating film 701. A side insulating layer may be disposed between the first input/output contact plug 703 and the first substrate 710 and may electrically isolate the first input/output contact plug 703 from the first substrate 710.

Referring to FIG. 16, an upper insulating film 801 covering the upper surface of the second substrate 810 may be formed on the second substrate 810, and a second input/output pad 805 may be disposed on the upper insulating film 801. The second input/output pad 805 may be connected to at least one of the plurality of circuit devices 720*a*, 720*b*, and 720*c* disposed in the peripheral circuit region PERI through the second input/output contact plug 803.

In example embodiments, the second substrate 810 and the common source line 820 may not be disposed in the region in which the second input/output contact plug 803 is disposed. Also, the second input/output pad 805 may not overlap the word lines 830 in a third direction (a Z-axis direction). Referring to FIG. 14, the second input/output contact plug 803 may be separated from the second substrate 810 in a direction parallel to the upper surface of the second substrate 810, may penetrate through an interlayer insulating layer 815 of the cell region CELL to be connected to the second input/output pad 805.

In example embodiments, the first input/output pad 705 and the second input/output pad 805 may be selectively formed. For example, the memory device 600 may only include the first input/output pad 705 disposed on the first substrate 710, or may only include the second input/output pad 805 disposed on the second substrate 810. Alternatively, the memory device 600 may include both the first input/output pad 705 and the second input/output pad 805.

In each of the external pad bonding region PA and the bit line bonding region BLBA, respectively included in the cell region CELL and the peripheral circuit region PERI, the metal pattern of the uppermost metal layer may be present as a dummy pattern, or an uppermost metal layer may be empty.

In the external pad bonding region PA, the nonvolatile memory device 600 form a lower metal pattern 773*a* having the same shape as that of the upper metal pattern 872*a* of the cell region CELL on the uppermost metal layer of the peripheral circuit region PERI to correspond to the upper metal pattern 872*a* formed on the uppermost metal layer of the cell region CELL. The lower metal pattern 773*a* formed on the uppermost metal layer of the peripheral circuit region PERI may not be connected to a contact in the peripheral circuit region PERI. Similarly, an upper metal pattern having the same shape as that of the lower metal pattern of the peripheral circuit region PERI may be formed on the upper metal layer of the cell region CELL to correspond to the lower metal pattern formed in the uppermost metal layer of the peripheral circuit region PERI in the external pad bonding region PA.

Lower bonding metals 771*b* and 772*b* may be formed on the second metal layer 740*b* of the word line bonding region WLBA. In the word line bonding region WLBA, the lower bonding metals 771*b* and 772*b* of the peripheral circuit region PERI may be electrically connected to the upper bonding metals 871*b* and 872*b* of the cell region CELL by a bonding method.

In the bit line bonding region BLBA, an upper metal pattern 892 having the same shape as that of the lower metal pattern 752 of the peripheral circuit region PERI may be formed on the uppermost metal layer of the cell region CELL to correspond to the lower metal pattern 752 formed on the uppermost metal layer of the peripheral circuit region PERI. In an example embodiment, a contact may not be formed on the upper metal pattern 892 formed on the uppermost metal layer of the cell region CELL.

In an example embodiment, a reinforced metal pattern having the same cross-sectional shape as that of the formed metal pattern may be formed on the uppermost metal layer of the other of the cell region CELL and the peripheral circuit region PERI to correspond to the metal pattern formed in the uppermost metal layer of one of the cell region CELL and the peripheral circuit region PERI. A contact may not be formed in the reinforced metal pattern.

According to an example embodiment, various snapshots may be stored in the memory device 600, based on various fault conditions inserted into the storage controller, in response to a command from the host. The snapshot stored in the memory device 600 may be extracted by the host and may allow the vendor to parse an unexpected error and to easily correct a fault.

Figure 17:
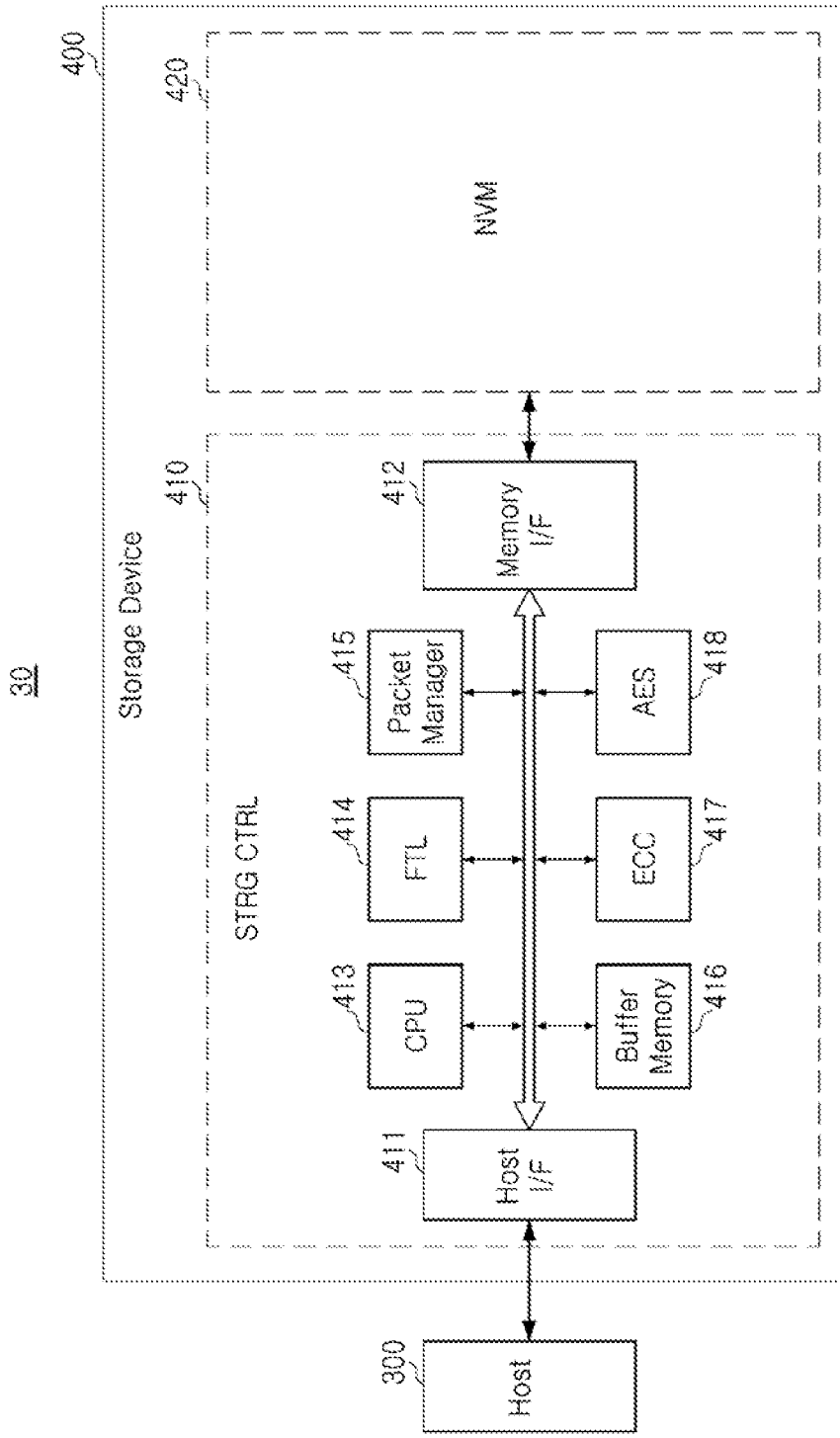

FIG. 17 is a block diagram of a host-storage system 30 according to an example embodiment.

The host-storage system 30 may include a host 300 and a storage device 400. Also, the storage device 400 may include a storage controller 410 and a nonvolatile memory (NVM) 420.

The storage device 400 may include storage media for storing data according to a request from the host 300. The host 300 and the storage device 400 may perform communication based on a standard interface protocol. The NVM 420 of the storage device 400 may include a flash memory or various other types of nonvolatile memory.

The storage controller 410 may include a host interface 411, a memory interface 412, and a central processing unit (CPU) 413. In addition, the storage controller 410 may further include a flash translation layer (FTL) 414, a packet manager 415, a buffer memory 416, an error correction code (ECC) engine 417, and an advanced encryption standard (AES) engine 418. The storage controller 410 may further include a working memory to which the flash translation layer (FTL) 414 is loaded, and the CPU 413 may execute the FTL 414 to control operations of writing and reading data to and from the NVM 420.

The host interface 411 may transmit and receive packets to and from the host 100, similarly to the host interface 214 described with reference to FIG. 1. The memory interface 412 may transmit and receive data to and from the NVM 420, similarly to the memory interface 218 described with reference to FIG. 1.

The FTL 414 may perform various functions such as address mapping, wear-leveling, and garbage collection.

The packet manager 415 may generate a packet complying with a protocol of the interface with the host 300, or may parse various types of information from the packet received from the host 300. Also, the buffer memory 416 may temporarily store data to be written to or read from the NVM 420. The buffer memory 416 may be provided in the storage controller 410, but may be disposed externally of the storage controller 410.

The ECC engine 417 may perform an error detection and correction function on read data read from the NVM 420. In greater detail, the ECC engine 417 may generate parity bits for write data to be written to the NVM 420, and the generated parity bits may be stored, together with the write data, in the NVM 420. When data from the NVM 420 is read, the ECC engine 417 may correct an error in the read data using the parity bits read from the NVM 420 together with the read data, and the error-corrected read data may be output.

The AES engine 418 may perform at least one of an encryption operation and a decryption operation on data input to the storage controller 410 using a symmetric-key algorithm.

The CPU 413 may include a plurality of processing cores. According to an example embodiment, the host 300 may select a processing core, among a plurality of processing cores, as a target core and may provide a fault condition for the selected target core to the storage device 400 through a fault insertion command. According to an example embodiment, the host 300 may easily provide a fault condition for the target core using a fault insertion command.

Figure 18:
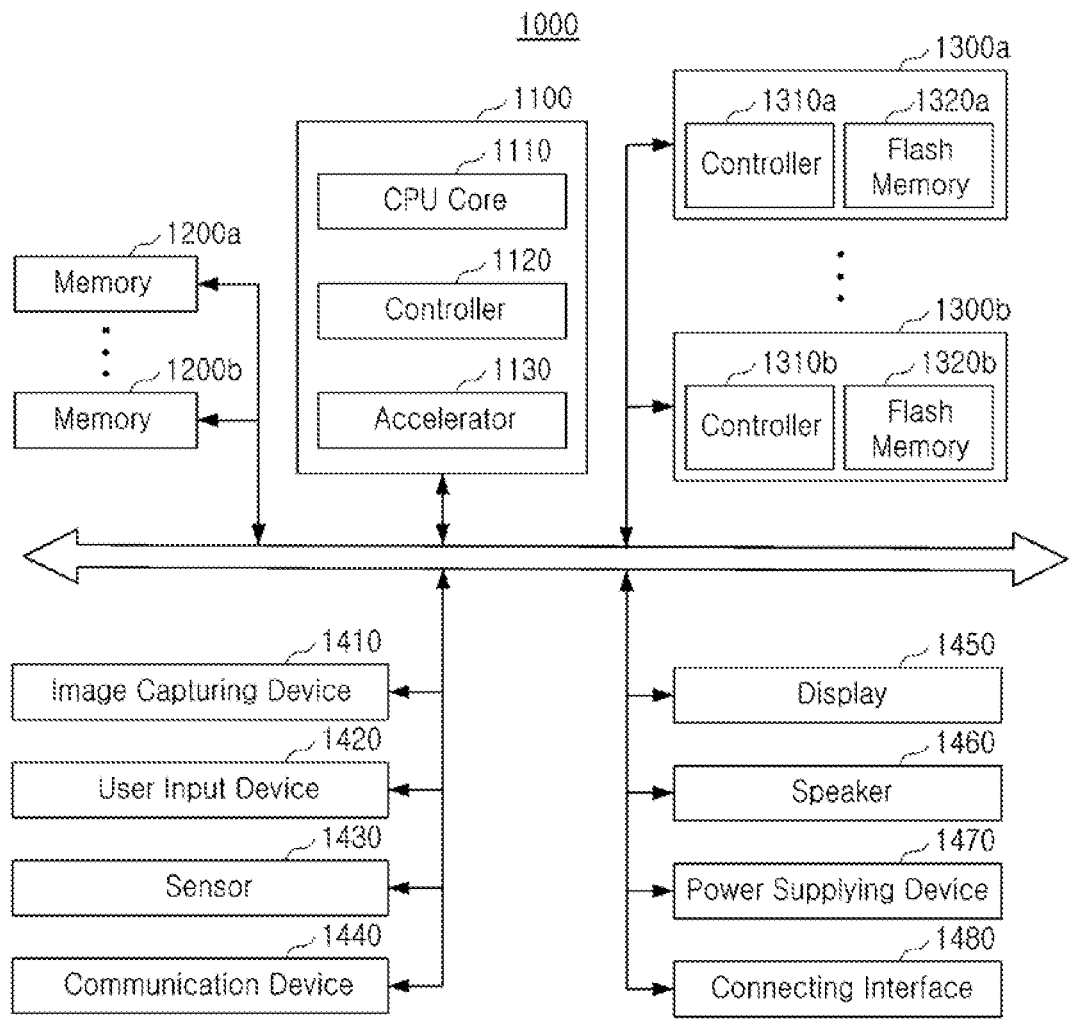

FIG. 18 is a diagram illustrating a system to which a storage device is applied according to an example embodiment. The system 1000 of FIG. 18 may be implemented as a mobile system such as a mobile phone, a smartphone, a tablet personal computer (PC), a wearable device, a healthcare device, or an Internet of things (IoT) device. However, the system 1000 of FIG. 18 is not limited to a mobile system, and may be implemented as a personal computer, a laptop computer, a server, a media player, or an automotive device such as a navigation system.

Referring to FIG. 18, the system 1000 may include a main processor 1100, memories 1200*a* and 1200*b*, and storage devices 1300*a* and 1300*b*, and may further include one or more of an image capturing device 1410, a user input device 1420, a sensor 1430, a communications device 1440, a display 1450, a speaker 1460, a power supplying device 1470, and a connecting interface 1480.

The main processor 1100 may control overall operations of the system 1000, and may control operations of the other components included in the system 1000. The main processor 1100 may be implemented as a general-purpose processor, a dedicated processor, or an application processor.

The main processor 1100 may include one or more CPU cores 1110, and may further include a controller 1120 for controlling the memories 1200*a* and 1200*b* and/or the storage devices 1300*a* and 1300*b*. In example embodiments, the main processor 1100 may further include an accelerator 1130 which may be a dedicated circuit for high-speed data operation such as artificial intelligence (AI) data operation. The accelerator 1130 may include a graphics processing unit (GPU), a neural processing unit (NPU), and/or a data processing unit (DPU), and may be implemented as a chip physically independent from the other components of the main processor 1100.

The memories 1200*a* and 1200*b* may be used as the main memory device of the system 1000 and may include a volatile memory such as SRAM and/or DRAM, or may include a nonvolatile memory such as a flash memory, PRAM and/or RRAM. The memories 1200*a* and 1200*b* may be implemented in the same packet as the main processor 1100.

The storage devices 1300*a* and 1300*b* may function as nonvolatile storage devices storing data regardless of whether power is supplied or not, and may have a relatively large storage capacity as compared to the memories 1200*a* and 1200*b*. The storage devices 1300*a* and 1300*b* may include storage controllers 1310*a* and 1310*b* and nonvolatile memories (NVM) 1320*a* and 1320*b* for storing data under the control of the storage controllers 1310*a* and 1310*b*. The NVMs 1320*a* and 1320*b* may include a flash memory having a two dimensional (2D) structure or three-dimensional (3D) vertical NAND (V-NAND) structure, or may include other types of nonvolatile memories such as a PRAM and/or an RRAM.

The storage devices 1300*a* and 1300*b* may be included in the system 1000 in a state of being physically separated from the main processor 1100, or may be implemented in the same packet as the main processor 1100. Also, the storage devices 1300*a* and 1300*b* may have the same shape as that of a solid state device (SSD) or a memory card, such that the storage devices 1300*a* and 1300*b* may be detachably coupled to the other components of the system 1000 through an interface such as a connecting interface 1480 to be described later. The storage devices 1300*a* and 1300*b* may fall under standard protocols such as universal flash storage (UFS), embedded multimedia card (eMMC), or nonvolatile memory express (NVMe), but example embodiments are not limited thereto.

According to an example embodiment, the storage devices 1300*a* and 1300*b* may add a fault condition in response to a fault insertion command from the main processor 1100, may perform various fault detection operations to detect a fault condition, and may store a snapshot.

The main processor 1100 may provide a fault insertion command, based on an interface protocol with the storage devices 1300*a* and 1300*b*, to easily add a fault condition for an unexpected error, and may perform debugging of the storage devices 1300*a* and 1300*b* based on the added fault condition.

The image capturing device 1410 may obtain a still image or videos, and may be implemented as a camera, a camcorder, and/or a webcam.

The user input device 1420 may receive various types of data input from a user of the system 1000, and may be implemented as a touchpad, a keypad, a keyboard, a mouse, and/or a microphone.

The sensor 1430 may detect various types of physical quantities obtained from an entity external to the system 1000, and may convert the sensed physical quantities into electrical signals. The sensor 1430 may include a temperature sensor, a pressure sensor, an illuminance sensor, a position sensor, an acceleration sensor, a biosensor and/or a gyroscope sensor.

The communications device 1440 may transmit signals to and receive signals from other external devices of the system 1000 in accordance with various communication protocols. The communication device 1440 may include an antenna, a transceiver, and/or a modem (MODEM).

The display 1450 and the speaker 1460 may function as output devices for outputting visual information and auditory information to the user of the system 1000, respectively.

The power supplying device 1470 may appropriately convert power supplied from a battery built in the system 1000 and/or an external power source and may supply the power to each component of the system 1000.

The connection interface 1480 may provide a connection between the system 1000 and an external device connected to the system 1000 and exchanging data with the system 1000. The connection interface 1480 may be implemented by various interface methods, such as an advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, universal serial bus (USB), secure digital (SD) card, multimedia card (MMC), eMMC, UFS, embedded universal flash storage (eUFS), or compact flash (CF) card.

As described above, according to example embodiments, configurations and operations related to a storage device for detecting a fault state to generate a snapshot and providing the snapshot to a host to parse an error may be provided.

According to example embodiments, a host may provide a fault insertion request based on an interface protocol with a storage device to control a condition in which the storage device stores a snapshot. The host may obtain snapshots, generated under various conditions, from the storage device to parse errors.

According to example embodiments, a storage controller may detect various types of fault state using various internal locations as a target in response to a fault insertion request from a host.

While example embodiments have been shown and described above, it will be apparent to those skilled in the art that modifications and variations could be made without departing from the scope of the present disclosure as defined by the appended claims.

What is claimed is:

1. An electronic system comprising:
a host; and
a storage device configured to exchange data with the host using an interface protocol,
wherein the host is configured to use the interface protocol to provide, to the storage device, a fault insertion command comprising a fault type to be detected by the storage device, a target location at which the fault type is to be detected by the storage device, and a fault condition, the fault condition comprising a plurality of conditions indicating a memory location, a comparison operator, and a value of the memory location,
wherein the storage device is further configured to dynamically add a fault detection operation in response to the fault insertion command from the host, perform the fault detection operation using the fault type included in the fault insertion command, the fault detection operation comprising at least one of an assert code execution operation, a memory polling operation, an interrupt polling operation, and a latency detection operation, on the target location of the storage device in response to receiving the fault insertion command from the host and executing the fault insertion command, and store a snapshot of a current state of the storage device as observed when the fault condition is detected as a result of performing the fault detection operation,
wherein the host is further configured to obtain, from the storage device, the stored snapshot using the interface protocol, and debug the storage device using the obtained snapshot, and wherein the interface protocol comprises a nonvolatile memory express (NVMe).

2. The electronic system of claim 1, wherein the target location comprises a target core and a target address when the fault type is an assert code execution type,
wherein the storage device comprises a plurality of processing cores, and
wherein the storage device is configured to insert an assert code comprising the fault condition to a target region, indicated by the target address, in an instruction tightly-coupled memory (ITCM) of the target core, among the plurality of processing cores, and execute the assert code to perform the fault detection operation.

3. The electronic system of claim 2, wherein the storage device is configured to store the assert code in a first empty region indicated by a first address in the ITCM, store an original code stored in the target region in a second empty region indicated by a second address in the ITCM, and store a branch instruction branching the target address into the first address in the target region to insert the assert code into the target region.

4. The electronic system of claim 2, wherein the storage device is configured to execute the assert code to check whether a value of a register of the target core corresponds to a predetermined value.

5. The electronic system of claim 4, wherein the fault condition comprises an identifier of the register, the predetermined value, and the comparison operator.

6. The electronic system of claim 1, wherein the target location comprises a target core and a target address when the fault type comprises a memory polling type, and
wherein the storage device comprises a plurality of processing cores and is configured to perform the fault detection operation by polling a memory region indicated by the target address in a data tightly-coupled memory (DTCM) of the target core, among the plurality of processing cores, and determining whether data stored in the memory region satisfies the fault condition.

7. The electronic system of claim 6, wherein the fault condition comprises a predetermined value and the comparison operator comparing a value of data with the predetermined value, the data being stored in the memory region.

8. The electronic system of claim 1, wherein the storage device comprises a plurality of processing cores and is configured to perform, when the fault type comprises an interrupt polling type, the fault detection operation by polling an interrupt associated with a target core indicated by the target location, among the plurality of processing cores, and detecting whether the interrupt satisfies the fault condition, when the fault type is an interrupt polling type.

9. The electronic system of claim 8, wherein the fault condition comprises occurrence type of the interrupt and a pin number of the storage device at which the interrupt occurs.

10. The electronic system of claim 1, wherein the fault insertion command further comprises a target operation when the fault type is a latency detection type, and
wherein the storage device comprises a plurality of processing cores and is configured to perform the fault detection operation by measuring a time required for the target operation in a target core indicated by the target location, among the plurality of processing cores, and detecting whether the time required for the target operation meets the fault condition.

11. The electronic system of claim 10, wherein the fault condition comprises a predetermined value, a unit of the predetermined value, and the comparison operator comparing the time required for the target operation with the predetermined value.

12. A storage controller configured to control a memory device, the storage controller comprising:
a plurality of processing cores;
a debugging core;
a volatile memory; and a host interface configured to communicate with a host based on a predetermined interface protocol,
wherein the debugging core is configured to add a fault detection operation in response to a fault insertion command received from the host, and perform the fault detection operation on the memory device by determining whether at least one of a register of the memory device, a data tightly-coupled memory (DTCM) of the memory device, an interrupt of the memory device, and an operation latency of the memory device, associated with a selected target core from among the plurality of processing cores of the storage controller, meets a fault condition based on the fault insertion command, the fault condition comprising a plurality of conditions indicating a memory location, a comparison operator, and a value of the memory location,
wherein the plurality of processing cores of the storage controller is configured to generate a snapshot based on data stored in instruction tightly-coupled memories (ITCMs) of the storage controller, the DTCM included in the plurality of processing cores of the storage controller and the volatile memory,
wherein the stored data is generated according to a result of performing the fault detection operation on the memory device, and wherein the predetermined interface protocol comprises a nonvolatile memory express (NVMe), and
wherein the plurality of processing cores of the storage controller is further configured to store the generated snapshot in the memory device.

13. The storage controller of claim 12, wherein the host interface is further configured to:
provide the snapshot, stored in the memory device, to the host in response to a request from the host.

14. The storage controller of claim 12, wherein the debugging core is configured to insert an assert code into an ITCM included in the selected target core, execute the assert code, and compare a value, stored in the register, with a predetermined value to determine whether the register meets the fault condition, in response to the fault insertion command.

15. The storage controller of claim 12, wherein the debugging core is configured to poll a target region, indicated by a target address of a DTCM included in the selected target core, and compare a data value, stored in the target region, with a predetermined value to determine whether the DTCM meets the fault condition, in response to the fault insertion command.

16. The storage controller of claim 12, wherein the debugging core is configured to determine whether the interrupt meets the fault condition by polling interrupts, the polling interrupts being associated with the selected target core and detecting whether a predetermined type of interrupt occurs in a predetermined location, in response to the fault insertion command.

17. The storage controller of claim 12, wherein the debugging core is configured to determine whether the operation latency meets the fault condition by measuring a time required for a predetermined operation of the selected target core and comparing the time required for the predetermined operation with a predetermined value, in response to the fault insertion command.

18. A storage controller configured to control a memory device, the storage controller comprising:
a plurality of processing cores; a host interface configured to communicate with a host based on a predetermined interface protocol; and
a debugging core configured to parse a defect insertion command received from the host to extract a fault type, a target core, and a fault condition from the defect insertion command, dynamically add a fault detection operation based on the fault type, the target core, and the fault condition, and to perform the fault detection operation on the target core of the storage controller from among the plurality of processing cores of the storage controller to detect occurrence of the fault condition within the memory device, the fault detection operation being selected from among a plurality of fault detection operations and corresponding to the fault type received from the host with the defect insertion command, the fault condition comprising a plurality of conditions indicating a memory location, a comparison operator, and a value of the memory location,
wherein the plurality of processing cores of the storage controller is configured to generate a snapshot, representing a current state of the memory device at a time when the snapshot was generated and the storage controller, in response to a detection of the fault condition and store the generated snapshot in the memory device, and wherein the predetermined interface protocol comprises a nonvolatile memory express (NVMe).

19. The storage controller of claim 18,
wherein the host interface is further configured to receive the defect insertion command from the host according to the predetermined interface protocol.

* * * * *